United States Patent
Akiyama et al.

(10) Patent No.: US 7,233,094 B2
(45) Date of Patent: Jun. 19, 2007

(54) PIEZOELECTRIC DEVICE COMPRISING ULTRAHIGHLY-ORIENTED ALUMINUM NITRIDE THIN FILM AND ITS MANUFACTURING METHOD

(75) Inventors: Morito Akiyama, Tosu (JP); Naohiro Ueno, Tosu (JP); Hiroshi Tateyama, Tosu (JP); Yoshitaka Sunagawa, Kyoto (JP); Yoshihiro Umeuchi, Kyoto (JP); Keiichiro Jinushi, Toshima-ku (JP)

(73) Assignee: National Institute of Advanced Industrial Science & Technology, Tokyo (JP)

( * ) Notice: Subject to any disclaimer, the term of this patent is extended or adjusted under 35 U.S.C. 154(b) by 34 days.

(21) Appl. No.: 10/516,333

(22) PCT Filed: May 29, 2003

(86) PCT No.: PCT/JP03/06796

§ 371 (c)(1),
(2), (4) Date: Apr. 18, 2005

(87) PCT Pub. No.: WO03/103066

PCT Pub. Date: Dec. 11, 2003

(65) Prior Publication Data

US 2005/0236710 A1    Oct. 27, 2005

(30) Foreign Application Priority Data

May 31, 2002    (JP)    ............... 2002-160568

(51) Int. Cl.
H01L 41/04    (2006.01)
H01L 41/18    (2006.01)
H04R 17/00    (2006.01)
(52) U.S. Cl. .................. 310/311; 310/313 A; 29/25.35
(58) Field of Classification Search .............. 29/25.35; 310/311, 313 A
See application file for complete search history.

(56) References Cited

U.S. PATENT DOCUMENTS

| | | | | |
|---|---|---|---|---|
| 6,045,626 | A * | 4/2000 | Yano et al. | 148/33.4 |
| 6,312,568 | B2 * | 11/2001 | Wilke et al. | 204/192.18 |
| 6,515,402 | B2 * | 2/2003 | Klee et al. | 310/324 |
| 2005/0093397 | A1 * | 5/2005 | Yamada et al. | 310/320 |

FOREIGN PATENT DOCUMENTS

| | | |
|---|---|---|
| EP | 1 124 269 A2 | 8/2001 |
| EP | 001174525 A2 * | 1/2002 |
| GB | 0426814.0 | 3/2005 |
| JP | 2002-344279 (A) | 11/2002 |
| JP | 2003-198319 (A) | 7/2003 |

OTHER PUBLICATIONS

Electronegativity (Allred, Pauling, Pearson), 4 pages downloaded from http://www.matpack.de/Info/Nuclear/Elements/electronegativity.html.*
"Low-temperature growth of piezoelectric AlN film by rf reactive planar magnetron sputtering", T. Shiosaki et al., Appl. Phys. Lett. 36(8), Apr. 15, 1980, 643-645, © 1980 American Institute of Physics.
"Structural and electroacoustic studies of AlN thin films during low temperature radio frequency sputter deposition", F. Engelmark et al., J. Vac. Sci. Technol. A19(5), Sep./Oct. 2001, 2664-2669, © 2001 American Vacuum Society.
"Structural properties of AlN films grown on Si, Ru/Si and ZnO/Si substrates", Won Taeg Lim et al., Thin solid Films 382(2001) 56-60, © 2001 Elsevier Science.
"Synthesis and Surface Acoustic Wave Property of Aluminum Nitride Thin films Fabricated on Silicon and Diamond Substrates Using the Sputtering Method", M. Ishihara et al., Jpn. J. Appl. Phys, vol. 40(2001) pp. 5065-5068 Part 1, No. 8, Aug. © 2001 The Japan Society of Applied Physics.
"Deposition of AlN thin film using reactive sputtering method", Y. Honda et al., Reports of Kumamoto Industrial Research Institute No. 35, 1997, pp. 59-63 © Kumamoto Industrial Research Institute.

* cited by examiner

*Primary Examiner*—Evan Pert
(74) *Attorney, Agent, or Firm*—Nixon & Vanderhye PC

(57) ABSTRACT

The present invention has an objective to provide a high performance piezoelectric element in which is formed an aluminum nitride thin film free from hillocks, cracks, and peeling which exhibits superhigh c-axis orientation, by forming a bottom electrode from a W layer with no intervening adhesive layer on a glass or other cheap substrate. The piezoelectric element of the present invention is a piezoelectric element using a superhigh-oriented aluminum nitride thin film characterized in that the piezoelectric element is free from hillocks, cracks, and peeling and includes a stack structure in which a bottom electrode, a piezoelectric body thin film, and a top electrode are sequentially formed on a substrate; the bottom electrode is made of an oriented W layer of which a (111) plane of W is parallel to a surface of the substrate; and the piezoelectric body thin film is formed of a c-axis-oriented aluminum nitride thin film having a rocking curve full width half maximum (RCF-WHM) not exceeding 2.5°.

21 Claims, 13 Drawing Sheets

ON W THIN FILM

OPTICAL MICROSCOPIC PHOTOGRAPH
OF SURFACE OF AlN THIN FILM (x800)

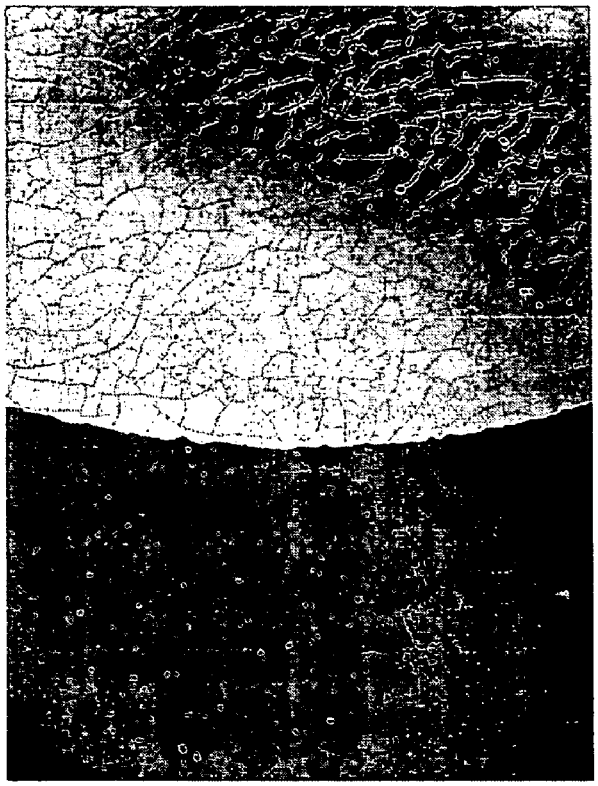
FIG. 2(b) ON Al-Si THIN FILM (×50)
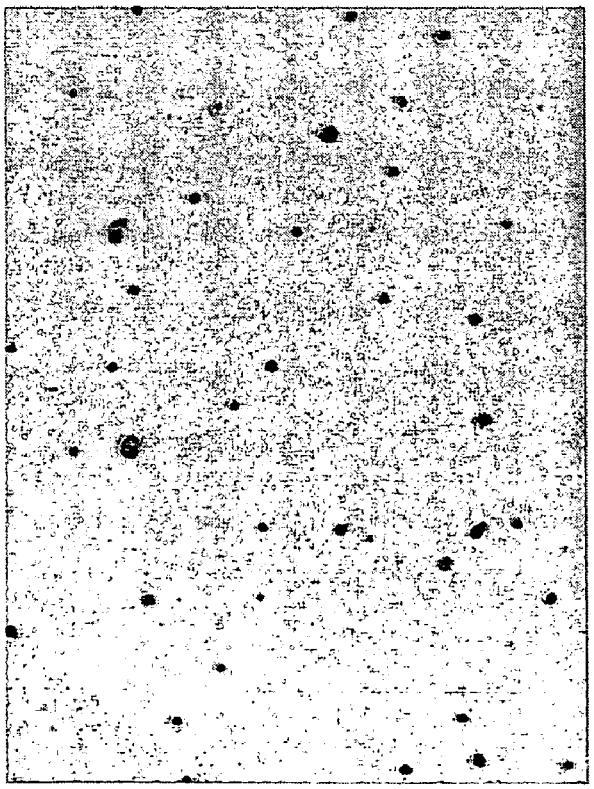
FIG. 2(a) ON Ti/Au THIN FILM (×800)
OPTICAL MICROSCOPIC PHOTOGRAPH OF SURFACE OF AlN THIN FILM

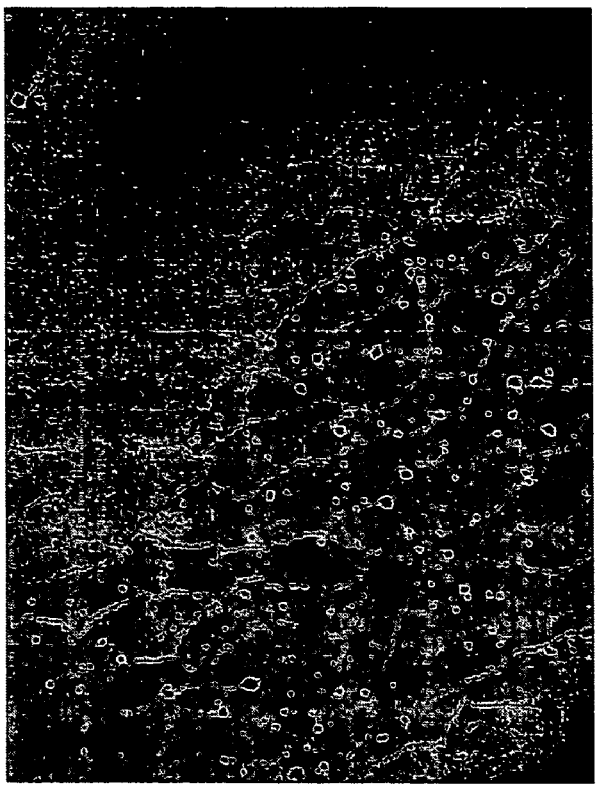
FIG. 3(b) ON Ni THIN FILM (x500)
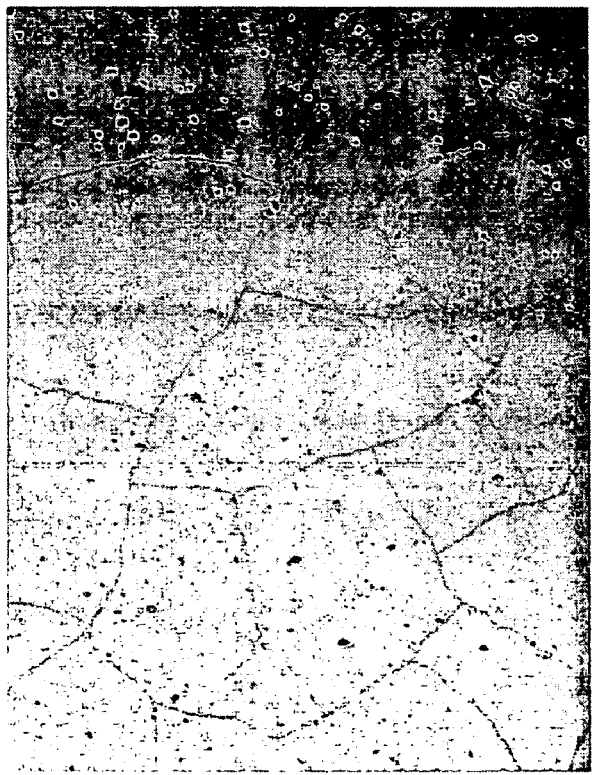
FIG. 3(a) ON Cr THIN FILM (x500)
OPTICAL MICROSCOPIC PHOTOGRAPH OF SURFACE OF AlN THIN FILM

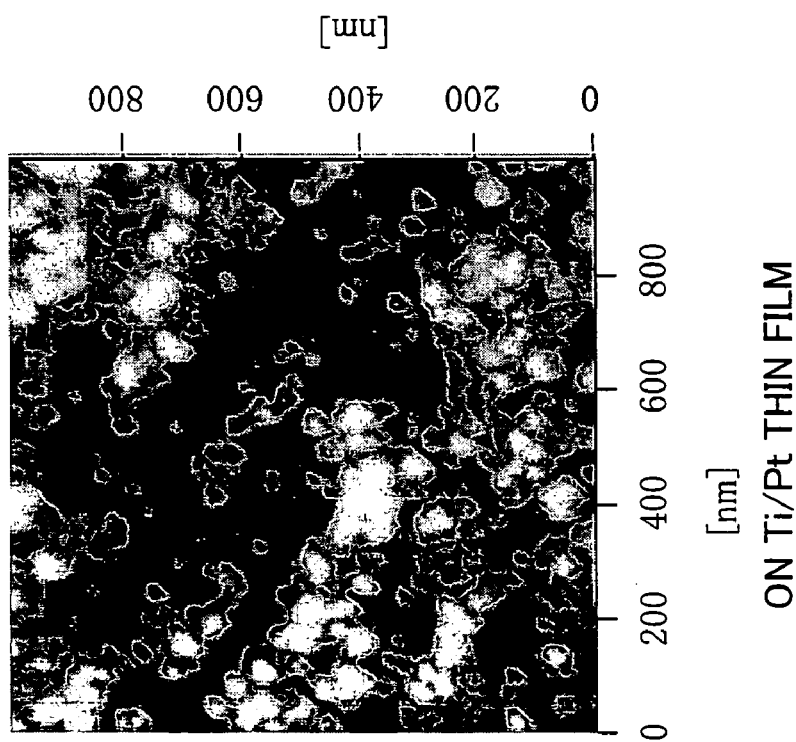
FIG. 6(b) ON Cr/Pt THIN FILM
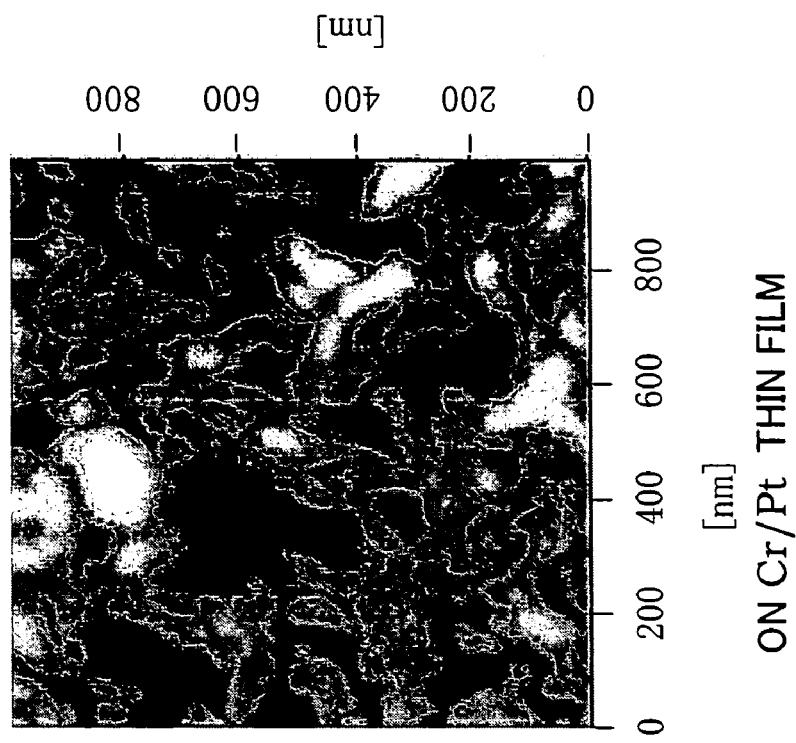
FIG. 6(a) ON Ti/Pt THIN FILM
ATOMIC FORCE MICROSCOPE (AFM) IMAGE OF SURFACE OF AlN THIN FILM

STRESS ACTING ON THIN FILM

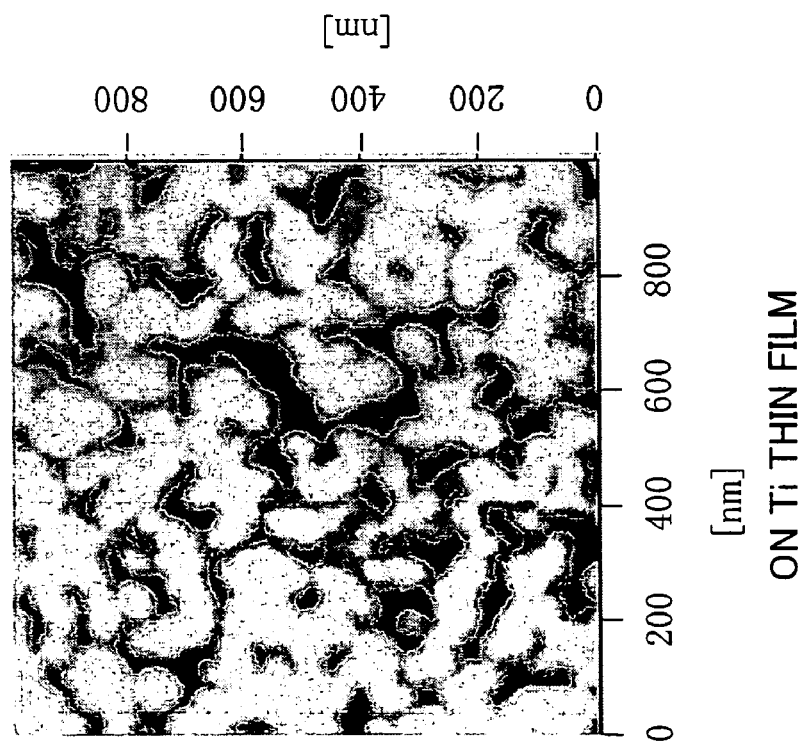
FIG. 8(b) ON Cr THIN FILM
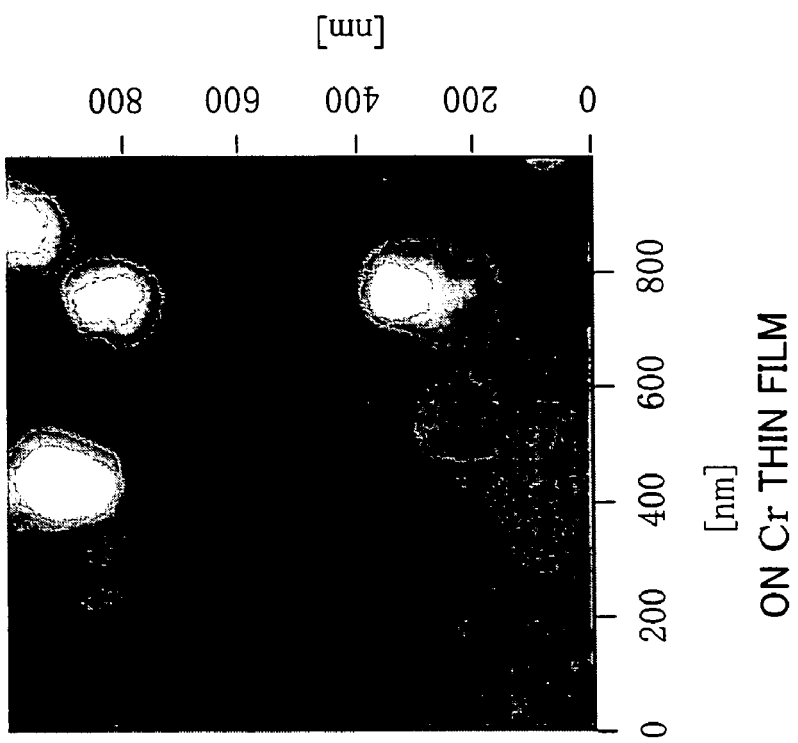
FIG. 8(a) ON Ti THIN FILM
ATOMIC FORCE MICROSCOPE (AFM) IMAGE OF SURFACE OF Pt THIN FILM

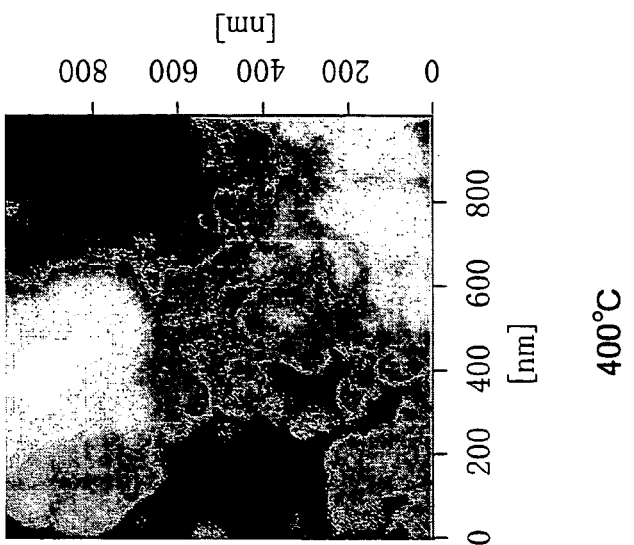
FIG. 9(c) 400°C
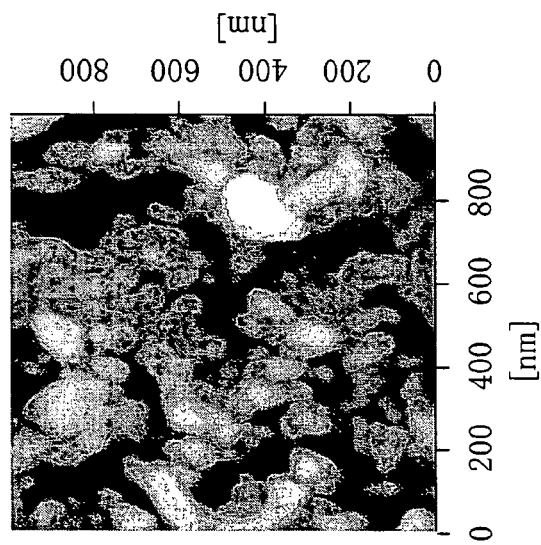
FIG. 9(b) 300°C
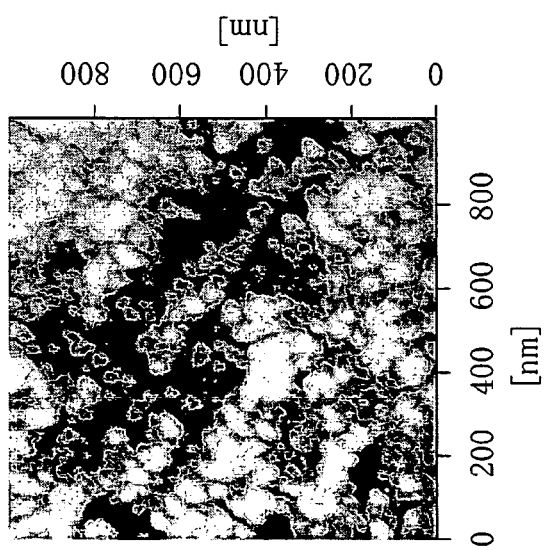
FIG. 9(a) ROOM TEMPERATURE
ATOMIC FORCE MICROSCOPE (AFM) IMAGES OF SURFACES OF AlN THIN FILMS ON Ti/Pt THIN FILMS PROCESSED AT DIFFERENT TEMPERATURES

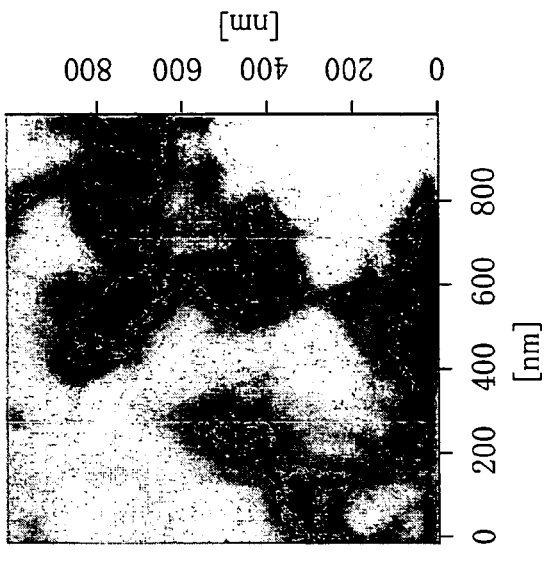
FIG. 10(c) 400°C
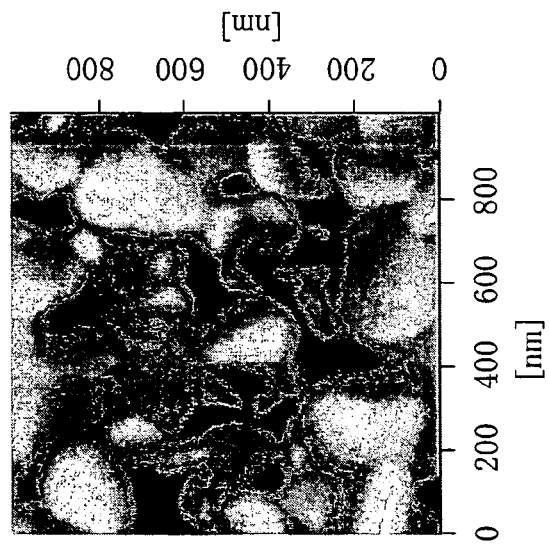
FIG. 10(b) 300°C
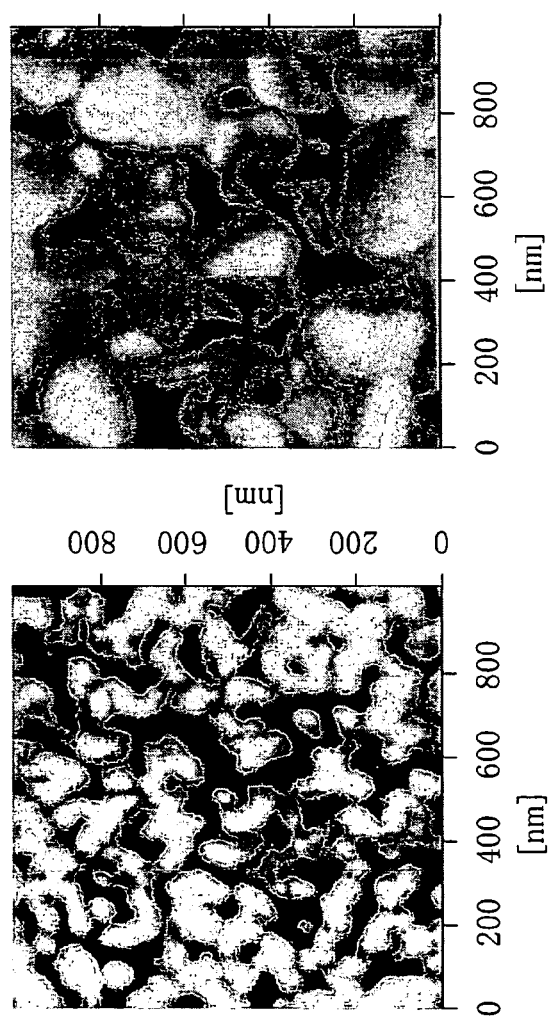
FIG. 10(a) ROOM TEMPERATURE
ATOMIC FORCE MICROSCOPE (AFM) IMAGES OF SURFACES OF Pt THIN FILMS ON Ti/Pt THIN FILMS PROCESSED AT DIFFERENT TEMPERATURES

LOAD-OUTPUT GRAPH

DIRECTION OF MEASUREMENT→

MICROSCOPE PHOTOGRAPH OF SCRATCH (×150)

PIEZOELECTRIC DEVICE COMPRISING ULTRAHIGHLY-ORIENTED ALUMINUM NITRIDE THIN FILM AND ITS MANUFACTURING METHOD

This application is the U.S. national phase of International Application PCT/JP03/06796 filed 29 May 2003 which designated the U.S. and claims benefit of Japanese Application No. 160568/2002 filed 31 May 2002, now International Publication No. WO03/103066 published 11 Dec. 2003.

TECHNICAL FIELD

The present invention relates to piezoelectric elements using a thin film, provided on a glass or other cheap substrate, in which aluminum nitride has a high c-axis orientation and manufacturing methods of such elements.

BACKGROUND ART

Aluminum nitride is a promising material in efforts to making more compact, thinner piezoelectric elements for, among other factors, its high fabricability into thin film. However, to utilize aluminum nitride as an piezoelectric element, the aluminum nitride needs to be oriented only along the c-axis. The more c-axis-oriented, the more piezoelectric. In addition, to use an aluminum nitride thin film as a piezoelectric element, the film needs be flanked on top and bottom by electrodes.

Thin films of c-axis-oriented aluminum nitride have been reportedly produced on glass and other substrates by various methods (T. Shiosaki, T. Yamamoto, T. Oda, A. Kawabata, Appl. Phys. Lett., 36 (1980) 643). There are also reports about the production on electrode film. These aluminum nitride films however have great rocking curve full width half maximums (RCFWHMs) of about 3.0° or more, a measure of c-axis orientation, and insufficient piezoelectricity.

Aluminum nitride films with superhigh c-axis orientation (2.5° or less in RCFWHM) are reported by, for example, F. Engelmark, G. F. Iriarte, I. V. Katardjiev, M. Ottosson, P. Muralt, S. Berg, J. Vac. Sci. Technol. A, 19 (2001) 2664. A monocrystal substrate is used as the substrate on which a monocrystal or polycrystalline thin film of aluminum nitride is directly formed. Therefore, no electrode can be provided between the substrate and the aluminum nitride thin film, which renders it difficult to use the film as an piezoelectric element.

Aluminum nitride films show very large inherent internal stress. When fabricated on an electrode, the film may create cracks in the electrodes or peel off the substrate together with the electrodes, raising serious problems in the applying to piezoelectric elements.

The present invention has an objective to provide a high performance piezoelectric element from an aluminum nitride thin film, with no hillocks or cracks, which does not peel off and exhibits superhigh c-axis orientation, by forming a bottom electrode from a W layer on a glass or like cheap substrate with no intervening adhesive layer.

The present invention has another objective to provide a high performance piezoelectric element from an aluminum nitride thin film which exhibits similar superhigh c-axis orientation, by selecting a suitable material for the surface layer of the bottom electrode in the formation of the bottom electrode which is a stack body containing not only a W layer, but also an adhesive layer. Specific stack structures of the bottom electrode will be also proposed.

The present invention provides an easy and cheap method of manufacturing a piezoelectric element based on the foregoing aluminum nitride thin film whereby the aluminum nitride thin film is given superhigh c-axis orientation with the occurrence of hillocks, cracks, and peeling being prevented through the control of particle shape.

The present invention has a further objective to achieve an equivalent level of performance with a cheap glass substrate to that with a monocrystal substrate.

The present invention has still another objective to provide a manufacturing method whereby the bottom electrode is formed by r.f. plasma-assisted sputtering to impart superhigh c-axis orientation to the aluminum nitride thin film.

DISCLOSURE OF INVENTION

A piezoelectric element using a superhigh-oriented aluminum nitride thin film in accordance with the present invention is characterized in that: the piezoelectric element is free from hillocks, cracks, and peeling and includes a stack structure in which a bottom electrode, a piezoelectric body thin film, and a top electrode are sequentially formed on a substrate; the bottom electrode is made of an oriented W layer of which a (111) plane of W is parallel to a surface of the substrate; and the piezoelectric body thin film is formed of a c-axis-oriented aluminum nitride thin film having a rocking curve full width half maximum (RCFWHM) not exceeding 2.5°.

Another piezoelectric element using a superhigh-oriented aluminum nitride thin film in accordance with the present invention is characterized in that: the piezoelectric element is free from hillocks, cracks, and peeling and includes a stack structure in which a bottom electrode, a piezoelectric body thin film, and a top electrode are sequentially formed on a substrate, the bottom electrode containing as a bottom layer an adhesive layer adhering to the substrate; the bottom electrode is made of a stack body; the stack body has a surface layer made of a metal layer having an electronegativity of around 1.4 and such an orientation that a crystal plane of a metal having an identical atomic configuration to an atomic configuration of the (001) plane of aluminum nitride and an almost equal atomic distance to an atomic distance on the (001) plane is parallel to a surface of the substrate; and the piezoelectric body thin film is formed of a c-axis-oriented aluminum nitride thin film having a RCFWHM not exceeding 2.5°.

Another piezoelectric element using a superhigh-oriented aluminum nitride thin film in accordance with the present invention is characterized in that: the piezoelectric element is free from hillocks, cracks, and peeling and includes a stack structure in which a bottom electrode, a piezoelectric body thin film, and a top electrode are sequentially formed on a substrate, the bottom electrode containing as a bottom layer an adhesive layer adhering to the substrate; the bottom electrode is made a stack body containing as a surface layer such an oriented W, Pt, Au, or Ag layer that a (111) plane of W, Pt, Au, or Ag is parallel to a surface of the substrate; and the piezoelectric body thin film is formed of a c-axis-oriented aluminum nitride thin film having a RCFWHM not exceeding 2.5°.

A method of manufacturing a piezoelectric element using a superhigh-oriented aluminum nitride thin film in accordance with the present invention is characterized by including the sequential steps of: forming a bottom electrode on a substrate from such an oriented W layer that a (111) plane of W is parallel to a surface of the substrate by sputtering at a temperature from room temperature to a low temperature at which no spaces develop between W particles; and forming a piezoelectric body thin film of a c-axis-oriented aluminum nitride thin film having a RCFWHM not exceeding 2.5° on the bottom electrode; and forming a top electrode on the piezoelectric body thin film.

Another method of manufacturing a piezoelectric element using a superhigh-oriented aluminum nitride thin film in accordance with the present invention is characterized by including the sequential steps of: in forming, on a substrate, a bottom electrode of a two- or more-layered stack structure including an adhesive layer adhering to the substrate, firstly depositing the adhesive layer by sputtering at a temperature from room temperature to a low temperature at which no spaces develop between particles and then depositing as a surface layer of the bottom electrode a metal layer by sputtering at a temperature from room temperature to a low temperature at which no spaces develop between particles so that the metal layer exhibits such orientation that a crystal plane of a metal is parallel to a surface of the substrate, by using such a metal having an electronegativity of around 1.4 that a crystal plane of the metal has an identical atomic configuration to an atomic configuration on a (001) plane of aluminum nitride and an almost equal atomic distance to an atomic distance on the (001) plane; forming a piezoelectric body thin film of a c-axis-oriented aluminum nitride thin film having a RCFWHM not exceeding 2.5° on the bottom electrode; and forming a top electrode on the piezoelectric body thin film.

Another method of manufacturing a piezoelectric element using a superhigh-oriented aluminum nitride thin film in accordance with the present invention is characterized by including the sequential steps of: in forming, on a substrate, a bottom electrode of a two- or more-layered stack structure including an adhesive layer adhering to the substrate, firstly depositing the adhesive layer by sputtering at a temperature from room temperature to a low temperature at which no spaces develop between particles and then depositing as a surface layer an oriented W, Pt, Au, or Ag layer that a (111) plane of W, Pt, Au, or Ag is parallel to a surface of the substrate by sputtering at a temperature from room temperature to a low temperature at which no spaces develop between particles; forming a piezoelectric body thin film of a c-axis-oriented aluminum nitride thin film having a RCF-WHM not exceeding 2.5° on the bottom electrode; and forming a top electrode on the piezoelectric body thin film.

Additional objects, advantages and novel features of the invention will be set forth in part in the description which follows, and in part will become apparent to those skilled in the art upon examination of the following or may be learned by practice of the invention.

BRIEF DESCRIPTION OF DRAWINGS

FIG. 2(a) and FIG. 2(b) are optical microscopic photographs (images) of the surfaces of aluminum nitride thin films on a Ti/Au thin film (×800) and on an Al—Si thin film (×50) respectively.

FIG. 3(a) and FIG. 3(b) are optical microscopic photographs (images) of the surfaces of aluminum nitride thin films on a Cr thin film (×500) and on a Ni thin film ×500) respectively.

FIG. 6(a) and FIG. 6(b) are photographs of atomic force microscope (AFM) images of the surfaces of aluminum nitride thin films on a Ti/Pt thin film and on a Cr/Pt thin film respectively.

FIG. 8(a) and FIG. 8(b) are photographs of atomic force microscope (AFM) images of the surfaces of Pt thin films on a Ti thin film and on a Cr thin film respectively.

FIG. 9(a) to FIG. 9(c) are photographs of atomic force microscope (AFM) images of the surfaces of aluminum nitride thin films on Ti/Pt thin films processed at different temperatures, i.e., room temperature, 300° C., and 400° C. respectively.

FIG. 10(a) to FIG. 10(c) are photographs of atomic force microscope (AFM) images of the surfaces of Pt thin films on Ti/Pt thin films processed at different temperatures, i.e., room temperature, 300° C., and 400° C.

BEST MODE FOR CARRYING OUT THE INVENTION

Figure 1:
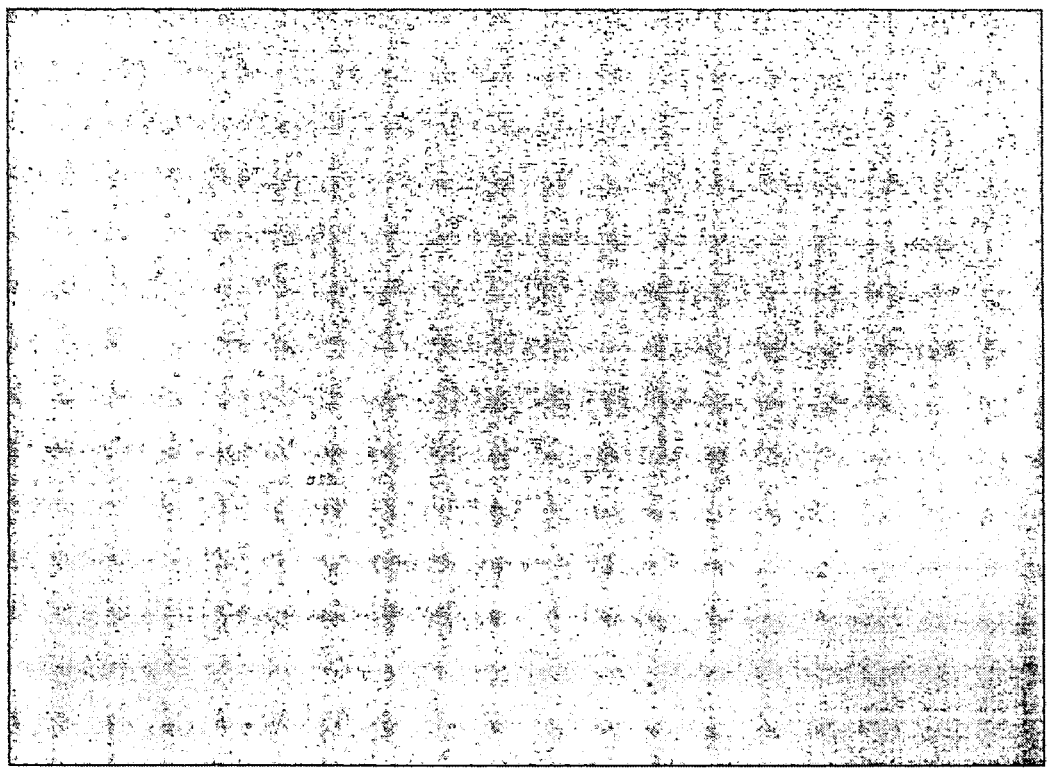
FIG. 1 is an optical microscopic photograph (image) of the surface of an aluminum nitride thin film on a W thin film.

The following will describe the present invention in detail by way of embodiments examples, which are by no means limiting the present invention.

A piezoelectric element in accordance with the present invention includes a stack structure in which a bottom electrode, a piezoelectric body thin film, and a top electrode formed sequentially on a substrate. A premise here is that the piezoelectric element is free from hillocks, cracks, or peeling in the present invention, because hillocks, cracks, and peeling, if having occurred with the bottom electrode, the piezoelectric body thin film, or the top electrode, seriously damage the reliability of the piezoelectric element.

In the present invention, the piezoelectric element is fabricated on a substrate. Thus its applications include pressure sensors and surface acoustic wave filters. In addition, the piezoelectric element can have improved sensitivity.

The substrate used in the present invention may be either a monocrystal substrate, such as a sapphire substrate, or a non-monocrystal substrate, such as a glass substrate, a polycrystalline ceramic substrate, a metal substrate, and a resin substrate. The present invention is applicable to monocrystal substrates. The invention is also applicable to non-monocrystal substrates, forming a film of aluminum nitride (AlN) with superhigh c-axis orientation on such substrates. Notably, the invention is expected to contribute to the production of piezoelectric elements at low cost.

The bottom electrode may be either a single metal layer or a stack body containing layers including an adhesive layer which adheres to the substrate.

The bottom electrode, if it is a single metal layer, is preferably fabricated from a W layer oriented in such a manner that the (111) plane of the W is parallel to the substrate surface.

If the bottom electrode is a stack body including an adhesive layer, the metal constituting the surface layer of the stack body preferably has an electronegativity between 1.3 and 1.5 inclusive, more preferably an electronegativity of around 1.4. On top of these conditions, the metal preferably has a crystal plane on which the atoms show the same configuration with almost the same atomic distances as those on a (001) plane of aluminum nitride, because that metal well matches the (001) plane of aluminum nitride. Specifically, the crystal plane of such a metal does not differ from the (001) plane of aluminum nitride in lattice constant, allowing the aluminum nitride to grow without deforming. In addition, the surface layer of the bottom electrode is preferably made of a such a metal layer oriented in such a manner that the crystal plane of such a metal is parallel to the substrate surface.

A concrete example of a bottom electrode which is a stack body including an adhesive layer is a stack body containing a W, Pt, Au, or Ag surface layer oriented in such a manner that the (111) plane of the W, Pt, Au, or Ag is parallel to the substrate surface, because the (111) plane of W. Pt, Au, and Ag well matches the (001) plane of aluminum nitride. Specifically, the (111) plane of W, Pt, Au, and Ag does not differ from the (001) plane of aluminum nitride in lattice constant.

Other concrete, preferred examples are Ti/Pt and Cr/Pt double layer. The notation "A/B" indicates that the metal A sits on the substrate, that is, the first layer, and that the metal B sits on the metal A, that is, the second layer. Further examples include Ti/Pt/Au, Ti/Ni/Au, and Cr/Ni/Au triple layer. The notation "A/B/C" indicates that the metal A sits on the substrate, that is, the first layer, that the metal B sits on the metal A, that is, the second layer, and that the metal C sits on the metal B, that is, the third layer.

With no intervening adhesive layer, the Pt, Au, or Ag bottom electrode grown on the substrate is likely to peel off and develop cracks under stress. The provision of an intervening adhesive layer effectively prevents peeling and the occurrence of cracks and hillocks. Besides, the adhesive layer enhances orientation on the (111) plane of Pt, Au, and Ag, thereby enabling an aluminum nitride thin film to form with super c-axis orientation.

Figure 13:
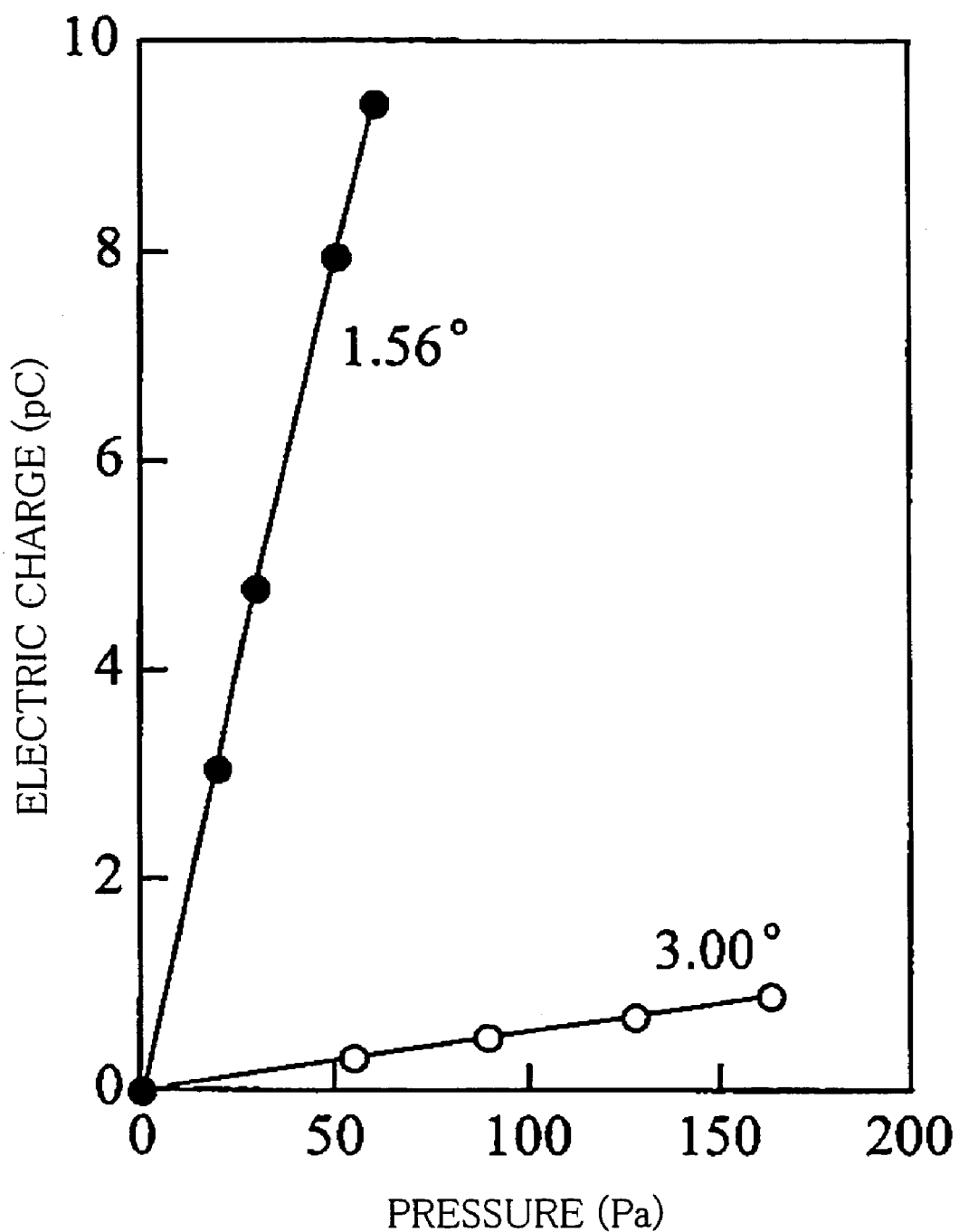
FIG. 13 is graph showing the relationship between pressure on a piezoelectric element and the electric charge it stores at different RCFWHMs.

The piezoelectric body thin film of the present invention is made of a super-c-axis-oriented aluminum nitride thin film with a rocking curve full width half maximum (RCFWHM) of 2.5° or less. Rocking curve measurement gives the deviation and range of the orientation of the crystal plane. Referring to FIG. 13, there exists a correlation between the RCFWHM and the electric charge stored in a piezoelectric element. The piezoelectric element stores more electric charge and shows better performance, with smaller RCFWHMs. In the present invention, the super-c-axis-oriented aluminum nitride thin film is defined as the aluminum nitride thin film with a RCFWHM of 2.5° or less.

The top electrode of the present invention can be made up a metal, such as Al, Pt, Au, and Ag; an alloy primarily of these metals; a conductive oxide, such as ITO, iridium dioxide, ruthenium dioxide, rhenium trioxide, and LSCO ($La_{0.5}Sr_{0.5}CoO_3$); or a conductive nitride, such as tantalum nitride. These are mere examples, and any conductive substance may be used provided that the substance adheres well to the aluminum nitride thin film and causes no substantial stress.

Now, a manufacturing method for the piezoelectric element of the present invention will be described. First, the substrate may be selected from monocrystal substrates, polycrystalline substrates, and amorphous substrates. In the present invention whereby a superhigh-c-axis-oriented aluminum nitride thin film can be grown regardless of the kind of substrate, however, it is preferable to select a polycrystalline substrate or an amorphous substrate. Glass substrates, especially, quartz glass substrates, are preferred.

In the present invention, physical vapor deposition (PVD) is used, because a metal is used to form the bottom electrode regardless of whether the electrode contains or does not contain an adhesive layer. Example of PVD include: vacuum vapor deposition, such as resistance thermal vapor deposition and electron beam thermal vapor deposition; various sputtering, such as DC sputtering, high frequency sputtering, r.f. plasma-assisted sputtering, magnetron sputtering, ECR sputtering and ion beam sputtering; various ion plating, such as high frequency ion plating, activated vapor deposition, and arc ion plating; molecular beam epitaxy; laser abrasion; ionized cluster beam vapor deposition; and ion beam vapor deposition. The bottom electrode is grown of a predetermined metal or alloy by these processes, preferably, by sputtering, and especially preferably, by r.f. plasma-assisted sputtering. A suitable vapor deposition process is selected from these methods, depending on a vapor-deposited substance.

The bottom electrode is deposited at low temperatures, preferably at room temperature. The temperature should however not be so low that spaces develop between metal particles constituting the bottom electrode. Spaces between particles would render the electrode more susceptible to cracks and peeling and a short circuit more likely between the top and bottom electrodes.

Above those temperatures at which spaces develop between particles, the particles may grow during film deposition, which would smooth out the fine structures of the bottom electrode. When this is the case, a short circuit is hardly likely. The electrode may be deposited at such temperatures that the particle growth eliminates spaces between particles and produces flat fine structures.

Deposition conditions are, for example, a pressure of $1.0\times10^{-1}$ Pa, a nitrogen gas partial pressure ratio of 0%, no substrate heating, and a target introduction electric power of 200 W. The film thickness is varied depending on the material. All these conditions may be suitably altered.

To form a bottom electrode of a two- or more-layered stack structure including an adhesive layer adhering to the substrate on the substrate, first, the adhesive layer is deposited by sputtering at a low temperature at which no spaces develop between particles, preferably at room temperature. Next, on the adhesive layer is formed an electrode surface which well matches the (001) plane of aluminum nitride. The electrode surface is, for example, a metal with an electronegativity of around 1.4 having a crystal plane on which the atoms show the same configuration with almost the same atomic distances as those on a (001) plane of aluminum nitride. Using this metal, a metal layer where the crystal plane of the metal is parallel to the substrate surface is deposited on the surface layer of the bottom electrode by sputtering so that the layer is oriented, to complete the bottom electrode. In this case, the deposition temperature is, as mentioned earlier, low, and at that temperature, no spaces develop between metal particles constituting the bottom electrode, preferably room temperature.

Under these circumstances, the surface layer may be formed by sputtering a W, Pt, Au, or Ag layer oriented in such a manner that the (111) plane of the W, Pt, Au or Ag is parallel to the substrate surface. In this case, the deposition temperature is low, and at that temperature no spaces develop between the metal particles, preferably, room temperature.

When forming a bottom electrode containing an adhesive layer, the bottom electrode is again preferably deposited by r.f. plasma-assisted sputtering.

Depositing the bottom electrode at a low temperature provides a suitable surface layer to orient aluminum nitride and eliminates differences in thermal expansion for lower stress, allowing for no cracks, hillocks, or peeling.

Next, a piezoelectric body thin film is deposited of a c-axis-oriented aluminum nitride thin film with a 2.5° or less RCFWHM on the bottom electrode. The step is performed by PVD, preferably by sputtering. Upon completion of the fabrication of the bottom electrode, the metal which is the electrode material constituting the surface layer of the bottom electrode is oriented in such a manner that the crystal plane on which the atoms show the same configuration with almost the same atomic distances as those on the (001) plane of aluminum nitride is parallel to the substrate. Therefore, a bed surface forms which is equivalent to sapphire and other monocrystals. A super-c-axis-orientated aluminum nitride thin film is obtained by forming a thin film on the surface layer of the bottom electrode by PVD whereby the aluminum nitride is the target. Deposition conditions here are, for example, a pressure of $1.3 \times 10^{-1}$ Pa, a nitrogen gas partial pressure ratio of 60%, a substrate temperature of 300° C., and a target introduction electric power of 200 W. The film thickness is 2000 nm. These conditions may be suitably altered.

Then, a top electrode is formed on the piezoelectric body thin film. The top electrode material is formed by either PVD or CVD. A suitably vapor deposition process is selected depending on the vapor-deposited substance.

EXAMPLES

The following will describe the present invention in more detail by way of examples. Chemical elements are denoted by symbols in the present invention.

Fabrication of High Orientation Thin Film

The electrical properties of an aluminum nitride thin film, including electromechanical coupling factor, is known to vary greatly depending on crystal orientation. Accordingly, to obtain a high orientation AlN thin film, effects of a bottom electrode and stack effects of a bottom electrode were examined.

Example 1

Effects of Bottom Electrode

Most researches into AlN thin film growth on a conductor have been conducted around the improvement of iron's corrosion resistance and the growth on Al electrodes for use in a surface acoustic wave (SAW) filter. Only a small number of researches have been conducted into the growth on other conductors. According to reports, the highest orientation AlN thin film so far is fabricated on an Au thin film on a glass substrate and exhibits a rocking curve full width half maximum of 3°. Accordingly, to find the high orientation AlN thin film on a bottom electrode, an AlN thin film was fabricated on 20 types of conductor thin films, to observe the effects of a crystal structure to the AlN thin film. Most of the 20 types of conductor thin films were processed by sputtering at room temperature. Table 1 shows XRD measurements on the obtained AlN thin films. The substrates were all made of glass.

Specifically, each bottom electrode specimen was deposited on a quartz glass substrate (20 mm×20 mm×1.1 mm). Deposition conditions were a pressure of $1.0 \times 10^{-1}$ Pa, a nitrogen gas partial pressure ratio of 0%, no substrate heating, and a target introduction electric power of 200 W. The film thickness was varied depending on the material. The deposition conditions for aluminum nitride were a pressure of $1.3 \times 10^{-1}$ Pa, a nitrogen gas partial pressure ratio of 60%, a substrate temperature of 300° C., a target introduction electric power of 200 W, and a film thickness of 2000 nm.

TABLE 1

XRD measurements of AlN thin films on conductive body thin films

| Conductive body | RCFWHM (°) | Integrated (002) peak intensity | c-axis length (A) | (002) peak full width half maximum (°) |
|---|---|---|---|---|
| Au—Cr | 5.75 | 530814 | 4.980 | 0.25 |
| Al—Cu | 7.24 | 263574 | 4.986 | 0.28 |
| Al—Si | 5.67 | 401799 | 4.986 | 0.26 |
| Al—Cu—Si | 6.76 | 276111 | 4.986 | 0.27 |
| Al## | 5.67 | 401799 | 4.986 | 0.26 |
| Ni | 9.43 | 148275 | 4.982 | 0.28 |
| Cr | 10.34 | 51359 | 4.988 | 0.25 |
| Ta | 4.49 | 379861 | 4.988 | 0.28 |
| Nb | 4.17 | 280364 | 4.990 | 0.28 |
| Fe | 4.68 | 227047 | 4.990 | 0.29 |
| W | 2.14 | 5434083 | 4.982 | 0.19 |
| Ti/Pt | 2.06 | 6554966 | 4.982 | 0.18 |
| Ti/Ir | 6.53 | 225899 | 4.986 | 0.27 |
| | | 10381 (103) | | |
| Ti/Au | 1.57 | ** | 4.982 | 0.16 |
| Ti/Pd | 4.01 | 728326 | 4.982 | 0.23 |
| Ti/Rh | 4.60 | 1102793 | 4.986 | 0.18 |
| Ti/Ag | 2.44 | 2136965 | 4.982 | 0.19 |
| Ti/Mo | 7.33 | 246529 | 4.982 | 0.27 |
| | | 3858 (103) | | |
| Ti/Ru** | — | — | — | — |

\** Outside instrument's scale
\* \*Peeled off
\##Deposited in vacuum

Al—Si, Ni, Cr, and like materials are often used with semiconductors; if they can be used to form an electrode, they come in handy when the aluminum nitride piezoelectric element is integrated into a semiconductor device. Disappointedly, however, these materials had a high RCFWHM and developed many cracks. Pt and Au, if formed directly on a quartz substrate, did not adhere to the substrate well, resulting in frequent peeling. To address the problem, an adhesive layer of Ti, Cr, etc. was inserted. The measurements in Table 1 demonstrate that AlN thin films with superhigh orientation giving a rocking curve full width half maximum of about 2° were obtained on W, Ti/Pt, Ti/Au, and Ti/Ag.

For double-layer bottom electrodes, the left side element sits on the substrate, i.e. the first layer. For example, the notation, "Ti/Pt," indicates that Ti is the first layer and Pt is the second layer. For triple-layer bottom electrode, the notation is in the form "first layer/second layer/third layer."

Mass production with excellent microscopic crystal structure becomes difficult if macroscopic problems, such as cracks and peeling, occur. Accordingly, the AlN thin film surfaces were observed under an optical microscope. Results are shown in FIGS. 1, 2(a), 2(b), 3(a), and 3(b). FIG. 1 is an optical microscopic photograph (×800) of the surface of an AlN thin film with superhigh orientation and high crystallinity which was formed on a W thin film. The surfaces of the AlN thin films on W and Ti/Pt were smooth and uniform with no cracks or peeling observed at all as shown in FIG. 1.

In contrast, hillocks and large cracks were observed on the surface of the AlN thin films on Ti/Au and Ti/Ag as shown in FIG. 2(a). To exploit the existing semiconductor technology, it is better to use Al—Si. However, high orientation could not given to the AlN thin film on a Al—Si thin film, and intense cracking was observed as shown in FIG. 2(b). FIG. 3(a) and FIG. 3(b) are optical microscopic photographs of the surfaces of AlN thin films on a Cr thin film and a Ni thin film for comparison. Numerous cracks and some pinholes were observed in the AlN thin films on a Cr thin film, a Ni thin film, etc. developed as shown in FIG. 3(a) and FIG. 3(b). These results demonstrate that the AlN thin films on W and Ti/Pt exhibited high orientation and high crystallinity and developed no cracks, etc. Therefore, the W or Ti/Pt thin film form excellent bottom electrode thin films.

Figure 4:
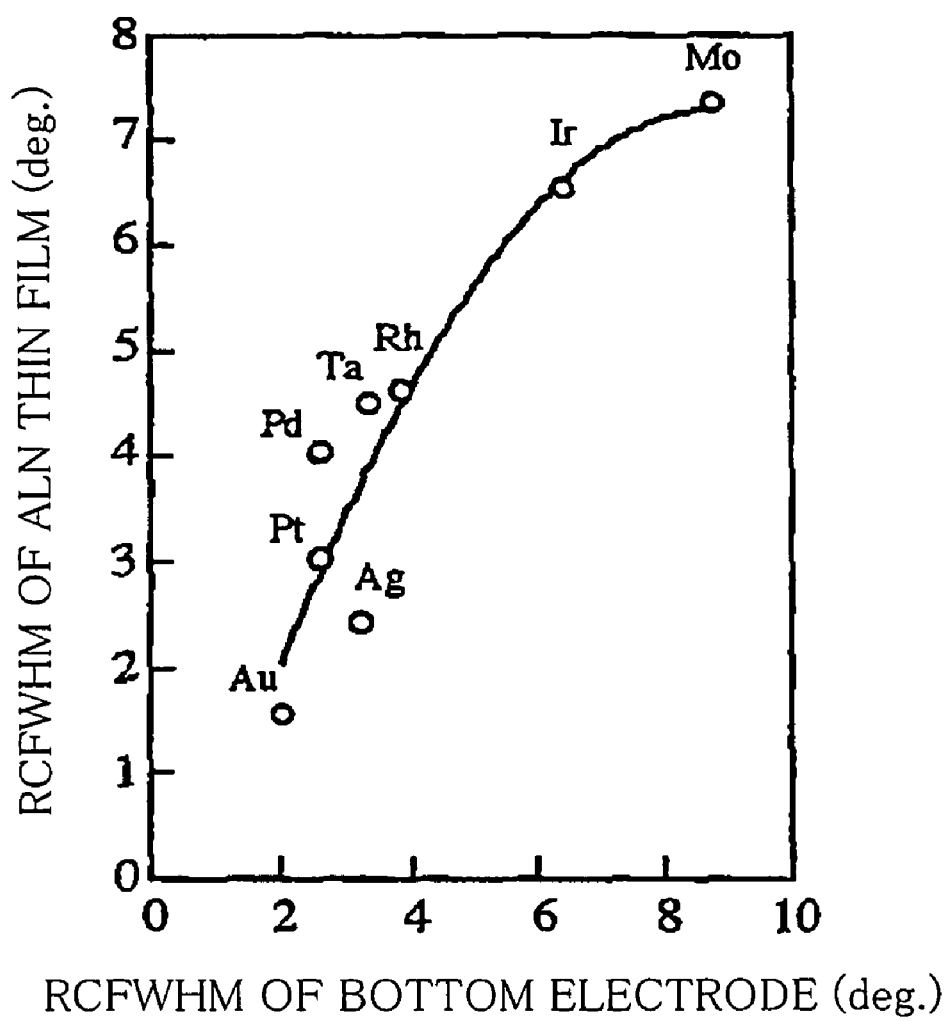
FIG. 4 is a drawing showing the relationship between the orientation of an aluminum nitride thin film and that of a bottom electrode thin film.
Figure 5:
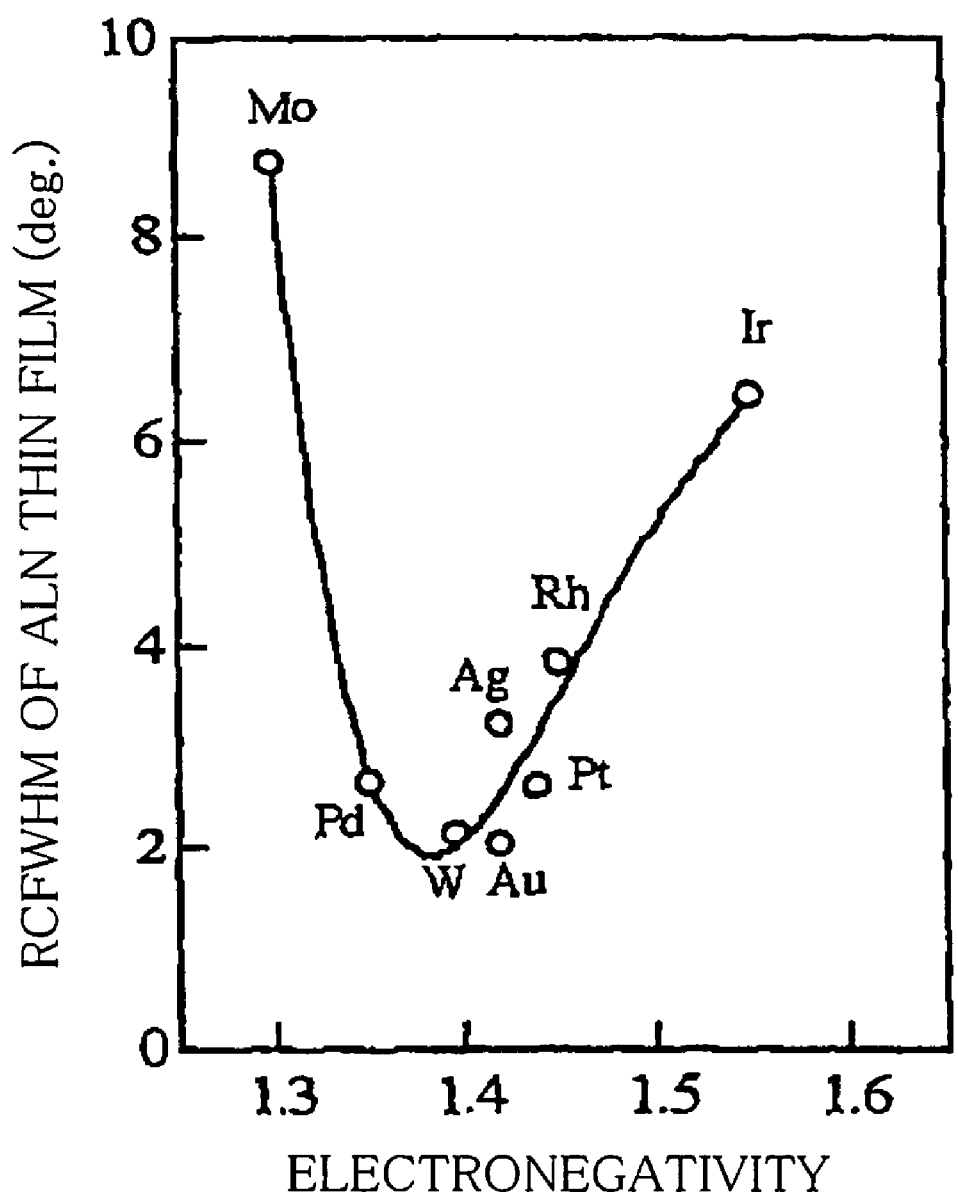
FIG. 5 is a drawing showing the relationship between the orientation of an aluminum nitride thin film and the electronegativity of a bottom electrode thin film.

To find out why the AlN thin film has an excellent crystal structure on W, Ti/Pt, Ti/Au, and Ti/Ag, we examined the relationship between the orientation of bottom electrode thin films and the orientation of the AlN thin films on those bottom electrode thin films and the relationship between the electronegativity of bottom electrode materials and the orientation of the AlN thin films on that bottom electrode thin films. Results are shown in FIG. 4 and FIG. 5. The orientation of the AlN thin film tended to increase with increasing orientation of the bottom electrode thin film. Also, the orientation of the AlN thin film was high when the electronegativity of the bottom electrode material is around 1.4. These results demonstrate that the AlN thin film on a conductor exhibited an excellent crystal structure when fabricated on a conductor with an electronegativity of around 1.4.

Example 2

Effects of Stacked Bottom Electrode

There has been no single report on stack effects of a bottom electrode for the AlN thin film. Accordingly, we examined effects on the AlN thin film crystal structure, such as orientation and crystallinity, of two and three metal thin films being stacked together.

We examined bottom electrodes containing Pt, i.e. Ti/Pt and Cr/Pt, which had high orientation and high crystallinity. The substrate was a quartz glass (20 mm×20 mm×1.1 mm). The deposition conditions for the bottom electrode were a pressure of $1.0 \times 10^{-1}$ Pa, a nitrogen gas partial pressure ratio of 0%, no substrate heating, and a target introduction electric power of 200 W. The film thickness was varied depending on the material. In addition, the deposition conditions for the aluminum nitride were a pressure of $1.3 \times 10^{-1}$ Pa, a nitrogen gas partial pressure ratio of 60%, a substrate temperature of 300° C., and a target introduction electric power of 200 W. The film thickness was 2000 nm.

Table 2 shows XRD results for the AlN thin films fabricated on these thin films. The change of the bottom segment from Ti to Cr greatly reduced the rocking curve full width half maximum of the AlN thin film from 2.06° to 0.40° and almost doubled the peak integrated intensity of the AlN (002) plane. The AlN (001) plane-to-plane distance (c-axis length) was $4.980 \times 10^{-8}$ m (4.980 angstroms). The AlN (001) plane-to-plane distances on the thin films were $4.982 \times 10^{-8}$ m (4.982 angstroms) and $4.984 \times 10^{-8}$ m (4.984 angstroms). It was inferred that the c-axis became a little longer and a compressive stress occurred perpendicular to the c-axis. These results demonstrate that the Cr thin film, although only a few tens of nanometers thick, greatly affected the crystal structure of the AlN thin film formed thereon. To the best of knowledge of the inventors, the only reported superhigh orientation AlN thin film with a rocking curve full width half maximum of 0.40° is made on a substrate of $\alpha$-$Al_2O_3$ monocrystal (sapphire) at substrate temperatures of 500° C. or higher. This is the first ever superhigh orientation AlN thin film made on a glass substrate at such a low temperature as 300° C.

TABLE 2

XRD measurements of AlN thin films on stacked thin films containing Pt

| Stack structure (nm) | RCFWHM (°) | Integrated (002) peak intensity | c-axis length (Å) | (111) peak full width half maximum (°) |
|---|---|---|---|---|
| Ti(20)/Pt(200) | 2.06 | 6554966 | 4.982 | 0.18 |
| Cr(40)/Pt(200) | 0.40 | 10931000 | 4.984 | 0.12 |

To find out effects of the bottom segment layers on the orientation and crystallinity of AlN thin films, the surfaces of the AlN thin films were observed under an atomic force microscope (AFM) which is a suitable tool to observe the surface of a very small area. Results are shown in FIG. 6(a) and FIG. 6(b). On a Ti/Pt thin film, the surface roughness (Ra) of the AlN thin film was 2.95 nm, with the surface formed by particles with a diameter of about 30 to 50 nm. See FIG. 6(a). In contrast, the surface roughness (Ra) of the AlN thin film on a Cr/Pt thin film which had high orientation was relatively low at 1.69 nm, with the surface formed by secondary particles (combined particles). See FIG. 6(b). Despite that the Cr/Pt sample was made of relatively large particles, the surface roughness was low, and the surface was flat. These results demonstrate that the bottom segment metal thin film had large effects on the orientation and crystallinity of the AlN thin film, that is, on the growth of the AlN thin film and that the selection of a bottom segment metal thin film material was very important to obtain an AlN thin film with excellent crystallinity.

Figure 7:
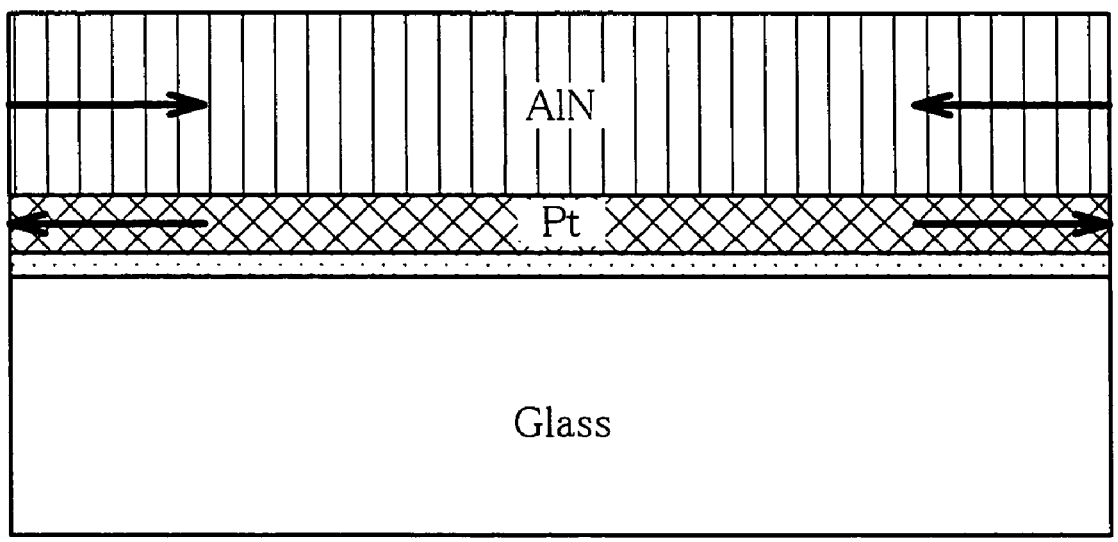
FIG. 7 is a conceptual drawing illustrating stress acting on a thin film.

To further examine the effects of the bottom segment Cr thin film, the crystal structure of the intervening Pt thin film was examined by XRD. Results are shown in Table 3. When the Ti bottom segment was replaced by a Cr bottom segment, the Pt thin film exhibited an increased rocking curve full width half maximum and a greatly decreased integrated intensity. In addition, since the Pt (111) plane-to-plane distance (lattice constant) was $2.2650 \times 10^{-8}$ m (2.2650 angstroms), the difference from the lattice constant of the Pt thin film became smaller. These results demonstrate that the use, of a Cr bottom segment reduces the orientation and crystallinity of the Pt thin film. Initially, we had presumed that the AlN thin film on the Pt thin film would exhibit high orientation and high crystallinity because of the high orientation and high crystallinity of the Pt thin film, however, it was understood that the orientation and crystallinity of the Pt thin film were not major factors dictating the crystal structure of the AlN thin film. There had to be different major factors dictating the crystal structure of AlN thin film. In addition, as shown in FIG. 7, from the changes of lattice constant, it is understood that the AlN thin film was under compressive stress and the Pt was under tensile stress.

TABLE 3

XRD measurements of Pt thin films after fabrication of AlN thin films

| Stack structure (nm) | RCFWHM (°) | Integrated (111) peak intensity | Lattice constant (A) | (002) peak full width half maximum (°) |
|---|---|---|---|---|
| Ti/Pt | 2.49 | 2380732 | 2.245 | 0.28 |
| Cr/Pt | 8.52 | 174918 | 2.255 | 0.36 |

To find out major factors dictating the crystal structure of the AlN thin film, the both Pt thin films were observed under a atomic force microscope (AFM). Results are shown in FIG. 8(a) and FIG. 8(b). On the Ti thin film, the surface roughness (Ra) of the Pt thin film was 1.99 nm, with the surface formed by uniform particles with a diameter of about 50 nm (FIG. 8(a)). In contrast, on the Cr thin film, the surface roughness (Ra) of the Pt thin film was 4.09 nm. Some particles with a diameter of about 200 nm were observed, and the surface was not uniform. Where there were no particles, the surface was very flat. See FIG. 8(b). From these results, we inferred that the improved orientation and crystallinity of the AlN thin film with a Cr bottom segment was caused by the drop in the surface roughness, that is, the improved flatness, of the Pt thin film.

Next, we examined stack effects of bottom electrodes containing Au, i.e. Ti/Au, Ti/Pt/Au, Ti/Ni/Au, and Cr/Ni/Au. Results are shown in Table 4. The rocking curve full width half maximum was substantially around 1.6° for all the samples. There were no significant differences. No significant differences were found either for the (002) peak integrated intensity. Therefore, no stack effects were observed with the Au-containing thin film in contract to the Pt-containing thin film.

TABLE 4

Effects of thin film stack structure containing Au layer on AlN thin films

| Stack structure (nm) | RCFWHM (°) | Integrated (002) peak intensity | c-axis length (A) | (002) peak full width half maximum (°) |
|---|---|---|---|---|
| Ti/Au | 1.57 | * | 4.982 | 0.16 |
| Ti/Pt/Au | 1.57 | 7357359 | 4.986 | 0.15 |
| Ti/Ni/Au | 1.56 | 6666020 | 4.986 | 0.17 |
| Cr/Ni/Au | 1.77 | 7352273 | 4.982 | 0.16 |

* Immeasurable

To find out why no stack effects were observed with Au-containing electrodes, the crystal structure of Au thin film samples were examined by XRD. Results are shown in Table 5.

TABLE 5

XRD measurements of Au thin film stack structure

| Stack structure (nm) | RCFWHM (°) | Integrated (111) peak intensity | Lattice constant (A) | (111) peak full width half maximum (°) |
|---|---|---|---|---|
| Ti/Au | * | * | * | * |
| Ti/Pt/Au | 1.62 | 7158859 | 2.334 | 0.27 |
| Ti/Ni/Au | 4.36 | 1262213 | 2.325 | 0.31 |
| Cr/Ni/Au | 6.60 | 651529 | 2.317 | 0.26 |

* Outside instrument's scale

The peak rocking curve full width half maximum of the Au (111) plane varied greatly from 1.62 to 6.60°. The integrated intensity also varied greatly, by a whole order of magnitude. In addition, the Au (111) plane-to-plane distance was $2.3550 \times 10^{-8}$ m (2.3550 angstroms). The Au lattice constant was, however, short for all the electrodes. The lattice constant for Cr/Ni/Au was the shortest at $2.317 \times 10^{-8}$ m (2.317 angstroms). This was presumably due to large tensile stress acting on the Au thin film. These results demonstrate that AlN thin films on Au-containing electrodes exhibited high orientation and high crystallinity regardless of the orientation and crystallinity of the Au. In this case, the flatness of the thin film surface was again inferred to be a major factor. In addition, the AlN thin film is under compressive stress, and the Au thin film is under tensile stress, as shown in FIG. 7.

Similar comparison was made for Al and Al-containing (Cr/Al) electrodes. Results are shown in Table 6. The rocking curve full width half maximum dropped from 5.88° to 2.57°. The integrated intensity increased from 600,000 to 2,090,000 (cps). These results demonstrate that Al-containing bottom segment thin films greatly affect the orientation and crystallinity of the AlN thin film, that is, the growth, of the AlN thin film. Therefore, to obtain an AlN thin film with excellent crystallinity, the selection of material for the bottom segment metal thin film should be given due consideration.

TABLE 6

Effects of thin film stack structure containing Al layer on AlN thin films

| Stack structure (nm) | RCFWHM (°) | Integrated (002) peak intensity | c-axis length (A) | (002) peak full width half maximum (°) |
|---|---|---|---|---|
| Cr/Al EB vapor deposition | 2.57 | 2091808 | 4.986 | 020 |
| Al (AIST) | 5.88 | 605246 | 4.982 | 0.26 |

In examples 1, 2, the effects of the bottom electrode and the stacking thereof were examined for the purpose of fabricating a superhigh orientation AlN thin film. The examination revealed that the orientation, crystallinity, etc. of the AlN thin film undergo substantial changes depending on the type of bottom electrode and the stack structure of the bottom electrode. In other words, the examination of the effects of the bottom electrode led to successful fabrication of high orientation AlN thin films on W, Ti/Au, Ti/Ag and Ti/Pt thin films. However, hillocks and large cracks were observed on the AlN thin films formed on Ti/Au and Ti/Ag thin films. Ti/Au and Ti/Ag turned out unfit for bottom electrode material. In contrast, the surface of the AlN thin films on W and Ti/Pt were uniform and almost free from cracks and peeling, which demonstrated that W or Ti/Pt were suitable bottom electrode materials. The bottom electrode materials commonly tend to exhibit improved orientation and crystallinity of the AlN thin film with increased orientation and crystallinity of the bottom electrode. In addition, materials having an electronegativity of around 1.4 are suitable electrode materials.

Examining the stack effects of the bottom electrode revealed that when the thin film contains Pt, the bottom segment thin film material greatly affect the orientation and crystallinity of the AlN thin film, that is, the growth, of the AlN thin film. To obtain an AlN thin film with excellent crystallinity, the bottom segment substance should be optimized. It is inferred that Cr bottom segments improve the orientation and crystallinity of the AlN thin film because of the reduced surface roughness (increased flatness) of the Pt thin film. For Al-containing thin films, large effects were again observed due to Cr. For Au-containing thin films, however, little change was observed.

These results show that AlN thin films with superhigh orientation (rocking curve full width half maximum=0.4°) are obtainable on a glass substrate at low temperatures, if the W thin film, Ti/Pt stack thin film, or Cr/Pt stack thin film is used for the bottom electrode.

Prevention of Cracks and Short-Circuits

Cracks and pinholes are possible causes of the short-circuiting of the top and bottom electrodes. To prevent the occurring of these cracks and pinholes, the effects of the fabrication temperature of the bottom electrode and those of the fabrication method of the bottom electrode were examined. In addition, to evaluate the reliability of the AlN thin film as sensors and other piezoelectric elements, the adhesion strength of the AlN thin film was evaluated.

Example 3

Effects of Fabrication Temperature of Bottom Electrode

Possible causes of cracks and peeling are differing thermal expansion coefficients of the substrate and bottom electrode and the AlN. Accordingly, to reduce the effects of the differing thermal expansion coefficients for prevention of cracks and peeling, the effects of the fabrication temperature of the bottom electrode was examined. Ti/Pt thin films with high orientation were used as bottom electrodes. Ti/Pt bottom electrodes were fabricated at room temperature, 300° C., and about 400° C. The top electrode was an Al thin film fabricated by vacuum vapor deposition. Three samples were simultaneously fabricated at different temperatures, to examine short-circuiting of the samples.

When the bottom electrode was fabricated at room temperature, all the samples experienced no short circuiting. In contrast, when the bottom electrode was fabricated at 300° C., one third of the samples experienced no short circuiting. When the bottom electrode was fabricated at 400° C., none of the samples experienced short circuiting. The results demonstrate that the Ti/Pt bottom electrode should be fabricated at either room temperature or 400° C. to fabricate samples with no short circuiting.

To examine the effects of the fabrication temperature of the bottom electrode on the crystal structure of the AlN thin film, the crystal structure of the samples were measured by XRD. Results are shown in Table 7. The higher the fabrication temperature of the Ti/Pt bottom electrode thin film, the greater the rocking curve full width half maximum of the (002) plane of the AlN thin film, and the lower the peak integrated strength of the (002) plane. No effects of the fabrication temperature on the c-axis length were observed. C-axis lengths were all about $4.980 \times 10^{-8}$ m (4.980 angstroms). No internal stress occurred. The results demonstrate that the higher the fabrication temperature of the Ti/Pt bottom electrode thin film, the lower the orientation and crystallinity of the AlN thin film. Therefore, the bottom electrode thin film should be fabricated at room temperature to obtain an AlN thin film with no short circuits with high orientation and high crystallinity.

TABLE 7

XRD measurements of AlN thin films on bottom electrode thin films fabricated at different temperatures

| Temperature | RCFWHM (°) | Integrated (002) peak intensity | c-axis length (A) | (002) peak full width half maximum (°) |
|---|---|---|---|---|
| Room temperature | 2.18 | 6554966 | 4.982 | 0.18 |
| 300° C. | 2.19 | 6140362 | 4.982 | 0.18 |
| 400° C.* | 2.68 | 3379954 | 4.982 | 0.21 |

*AlN thin films also fabricated at 400° C.

To further examine the effects of fabricate conditions for the bottom electrode, the surface shape of the samples were examined under an atomic force microscope. Results are shown in FIG. 9(a) to FIG. 9(c). Measurements of the surface roughness and mean particle diameters are shown in Table 8. Referring to FIG. 9(a) to FIG. 9(c), the higher the fabrication temperature of the Ti/Pt thin film, the greater the size of the particles forming the AlN thin film. Many spaces were observed between particles for 300° C. However, for 400° C., the particle diameter grew, but no spaces between particles were observed. In addition, the surface roughness also tended to increase with increasing fabrication temperature and reached 17.9 nm at 400° C. These results demonstrate that the fabricated samples do not experience short circuiting at room temperature and 400° C., because the formed film included no spaces and is of very fine structure.

TABLE 8

Surface roughness and mean particle diameter of AlN thin films on electrodes fabricated at different temperatures

| Temperature | Surface roughness (Ra) (nm) | Mean particle diameter (nm) |
|---|---|---|
| Room temperature | 1.6 | 28.5 |
| 300° C. | 3.1 | 52.1 |
| 400° C. | 17.9 | — |

To examine direct effects of the fabrication temperature of the bottom electrode on the Pt thin film, the crystal structure of the Pt thin film were measured by XRD. Results are shown in Table 9. The higher the fabrication temperature, the lower the rocking curve full width half maximum of the (111) plane of the Pt thin film, and the lower the integrated intensity. No peak was observed with the Pt thin film for 400° C. These results demonstrate that the higher the fabrication temperature, the lower the orientation and crystallinity of the Pt thin film. Therefore, it is inferred that the higher the fabrication temperature of the bottom electrode, the lower the orientation and crystallinity of the AlN thin film, because the orientation and crystallinity of the Pt thin film which is the bottom electrode falls with fabrication temperature.

TABLE 9

XRD measurements of Pt thin films after vapor deposition of AlN thin films

| Temperature | RCFWHM (°) | Integrated (111) peak intensity | Lattice constant (A) | (111) peak full width half maximum (°) |
|---|---|---|---|---|
| Room temperature | 2.49 | 2380732 | 2.245 | 0.28 |
| 300° C. | 7.15 | 316850 | 2.254 | 0.26 |
| 400° C. | * | * | * | * |

* No peak observed for Pt

To understand the surface shape of the Pt thin film samples in detail, an atomic force microscope was used in observation. Results are shown in FIG. 10(a) to FIG. 10(c). In addition, measurements of the surface roughness and mean particle diameters of Pt thin films fabricated at different temperatures are shown in Table 10. The higher the fabrication temperature of the Ti/Pt thin film, the greater the size of the particles forming the Pt thin film, and the greater crystal the particles formed. The surface roughness also tended to increase and showed remarkable increases for 400° C. These results demonstrate that the changes in the surface roughness and mean particle diameter of the AlN thin film with the fabrication temperature of the bottom electrode thin film were due to large changes in the surface roughness and mean particle diameter of the Pt thin film which is the bottom electrode with the fabrication temperature. Therefore, fabricating the bottom electrode at room temperature produces smooth-surfaced AlN thin films with no short circuits which exhibit high orientation and high crystallinity.

TABLE 10

Effects of fabrication temperature on surface roughness and mean particle diameter

| Temperature | Surface roughness (Ra) (nm) | Mean particle diameter (nm) |
|---|---|---|
| Room temperature | 1.9 | 65.9 |
| 300° C. | 2.8 | — |
| 400° C. | 15.9 | — |

The effects of fabrication temperature on short circuiting were examined further on four other bottom electrode materials (Cr/Pt, Ti/Pt/Au, Ti/Ni/Au, Cr/Ni/Au). Results are shown in Table 11.

TABLE 11

Sample short tests

| Bottom electrode structure | Fabrication temperature | Sample No. ① | ② | ③ |
|---|---|---|---|---|
| Cr/Pt | Room temperature | X | ○ | ○ |
|  | 300 | ○ | ○ | ○ |
| Ti/Pt/Au | Room temperature | ○ | ○ | ○ |
|  | 300 | X | ○ | X |
| Ti/Ni/Au | Room temperature | X | X | ○ |
|  | 300 | X | ○ | X |
| Cr/Ni/Au | Room temperature | ○ | ○ | ○ |
|  | 300 | ○ | ○ | ○ |

○: No Short
X: Short

The effects of fabrication temperature on short circuiting were examined also on a Cr/Pt bottom electrode. Two thirds of the Cr/Pt thin film samples fabricated at room temperature experienced no short circuiting. None of those fabricated at 300° C. experienced short circuiting at all. So, in the case of Cr/Pt, fabricating at 300° C. produced samples which were unlikely to see short circuiting. This was a different result from the case of Ti/Pt. Table 12 shows XRD measurements on AlN thin films differing in the fabrication temperature of the bottom electrode. In the case of Cr/Pt, the orientation and crystallinity again dropped when the fabrication temperature reached 300° C. These results were similar to those of the Ti/Pt case. In addition, no Pt peak was observed for 300° C. From these facts, Cr/Pt particles presumably undergo a different growth from Ti/Pt at 300° C., attaining different results.

TABLE 12

XRD measurements of AlN thin films on Cr/Pt bottom electrode fabricated at different temperatures

| Temperature | RCFWHM (°) | Integrated (002) peak intensity | c-axis length (A) | (002) peak full width half maximum (°) |
|---|---|---|---|---|
| Room temperature | 0.40 | 10931000 | 4.984 | 0.12 |
| 300° C. | 2.11 | 5789083 | 4.988 | 0.17 |

The effects of the fabrication temperature were also examined on Ti/Pt/Au bottom electrodes. All Ti/Pt/Au thin film samples fabricated at room temperature experienced no short circuiting. One third of those fabricated at 300° C. saw short circuiting. These results were similar to those of the Ti/Pt case. Table 13 shows XRD measurements on AlN thin films differing in the fabrication temperature of the bottom electrode. In the case of Ti/Pt/Au, the orientation and crystallinity again dropped when the fabrication temperature reached 300° C. These results were similar to those of the Ti/Pt case. In addition, no Au peak was observed for 300° C. From these facts, it is inferred that short circuiting occurs at 300° C., presumably because Ti/Pt/Au particles undergo a similar growth to Ti/Pt, creating spaces between particles.

XRD measurements of AlN thin films on Ti/Pt/Au bottom electrode fabricated at different temperatures

| Temperature | RCFWHM (°) | Integrated (002) peak intensity | c-axis length (A) | (002) peak full width half maximum (°) |
|---|---|---|---|---|
| Room temperature | 1.57 | 7357359 | 4.986 | 0.15 |
| 300° C. | 1.95 | 6815766 | 4.988 | 0.16 |

The effects of the fabrication temperature were also examined on Ti/Ni/Au bottom electrodes. Two thirds of Ti/Ni/Au thin film samples fabricated at room temperature experienced no short circuiting. One third of samples fabricated 300° C. experienced no short circuiting. Table 14 shows XRD measurements on AlN thin films differing in the fabrication temperature of the bottom electrode. In the case of Ti/Ni/Au, when the fabrication temperature reached 300° C., the orientation dropped, whereas the crystallinity improved. These results were different from, for example, Ti/Pt. In addition, no Ni and Au peaks were observed for 300° C. From these facts, it is inferred that short circuiting occurs at room temperature and at 300° C., presumably because Ti/Ni/Au particles undergo a different growth from Ti/Pt, etc., creating spaces between particles.

XRD measurements of AlN thin films on Ti/Ni/Au bottom electrode fabricated at different temperatures

| Temperature | RCFWHM (°) | Integrated (002) peak intensity | c-axis length (A) | (002) peak full width half maximum (°) |
|---|---|---|---|---|
| Room temperature | 1.56 | 6666020 | 4.986 | 0.17 |
| 300° C. | 1.78 | 7598293 | 4.988 | 0.16 |

The effects of the fabrication temperature were also examined on Cr/Ni/Au bottom electrodes. No Cr/Ni/Au thin film samples experienced short circuiting regardless of the fabrication temperature. Table 15 shows XRD measurements on AlN thin films differing in the fabrication temperature of the bottom electrode. In the case of Cr/Ni/Au, the orientation and crystallinity improved when the fabrication temperature reached 300° C. These results were different from, for example, Ti/Pt. In addition, no Ni and Au peaks were observed for 300° C. From these facts, it is inferred that no short circuiting occurs at room temperature and 300° C., presumably because Cr/Ni/Au particles undergo a different growth from Ti/Pt, etc., creating a fine structure film.

XRD measurements of AlN thin films on Cr/Ni/Au bottom electrode fabricated at different temperatures

| Temperature | RCFWHM (°) | Integrated (002) peak intensity | c-axis length (A) | (002) peak full width half maximum (°) |
|---|---|---|---|---|
| Room temperature | 1.77 | 7352273 | 4.982 | 0.16 |
| 300° C. | 1.66 | 9033786 | 4.988 | 0.15 |

Example 4

Effects of Fabrication Method of Bottom Electrode

Ti/Pt bottom electrode thin films were fabricated using a DC (DC) sputtering device to examine effects of different fabrication methods. Table 16 shows XRD measurements on AlN thin films fabricated on different thin films. The rocking curve full width half maximum was narrow, and the integrated intensity was high, with samples fabricated by r.f. plasma-assisted sputtering (RF). Insulation was also examined. None of the samples fabricated by r.f. plasma-assisted sputtering experienced short circuiting. Two thirds of those fabricated by DC sputtering experienced no short circuiting. These results show that r.f. plasma-assisted sputtering is better in fabricating Ti/Pt thin films.

TABLE 16

XRD measurements of AlN thin films on Ti/Pt thin films

| Fabrication process | RCFWHM (°) | Integrated (002) peak intensity | c-axis length (A) | (002) peak full width half maximum (°) |
|---|---|---|---|---|
| RF | 2.06 | 6554966 | 4.982 | 0.18 |
| DC | 2.61 | 2429798 | 4.982 | 0.21 |

DC: Direct current sputtering
RF: R.f. plasma-assisted sputtering

To examine causes of the difference, the crystal structure of Pt thin films was examined by XRD. Results are shown in Table 17. No significant differences were found in the full width half maximum and integrated strength of the (111) peak. These facts confirmed no effects of the different fabrication methods on the crystal structure of the Pt thin film. We assume flatness as a likely cause of effects.

TABLE 17

XRD measurements of Pt thin films

| Fabrication process | RCFWHM (°) | Integrated (111) peak intensity | Lattice constant (A) | (111) peak full width half maximum (°) |
|---|---|---|---|---|
| RF | 2.49 | 2380732 | 2.245 | 0.28 |
| DC | 2.62 | 1955266 | 2.251 | 0.29 |

DC: Direct current sputtering
RF: R.f. plasma-assisted sputtering

Example 5

Evaluation of Thin Film Adhesion Strength

Figure 11:
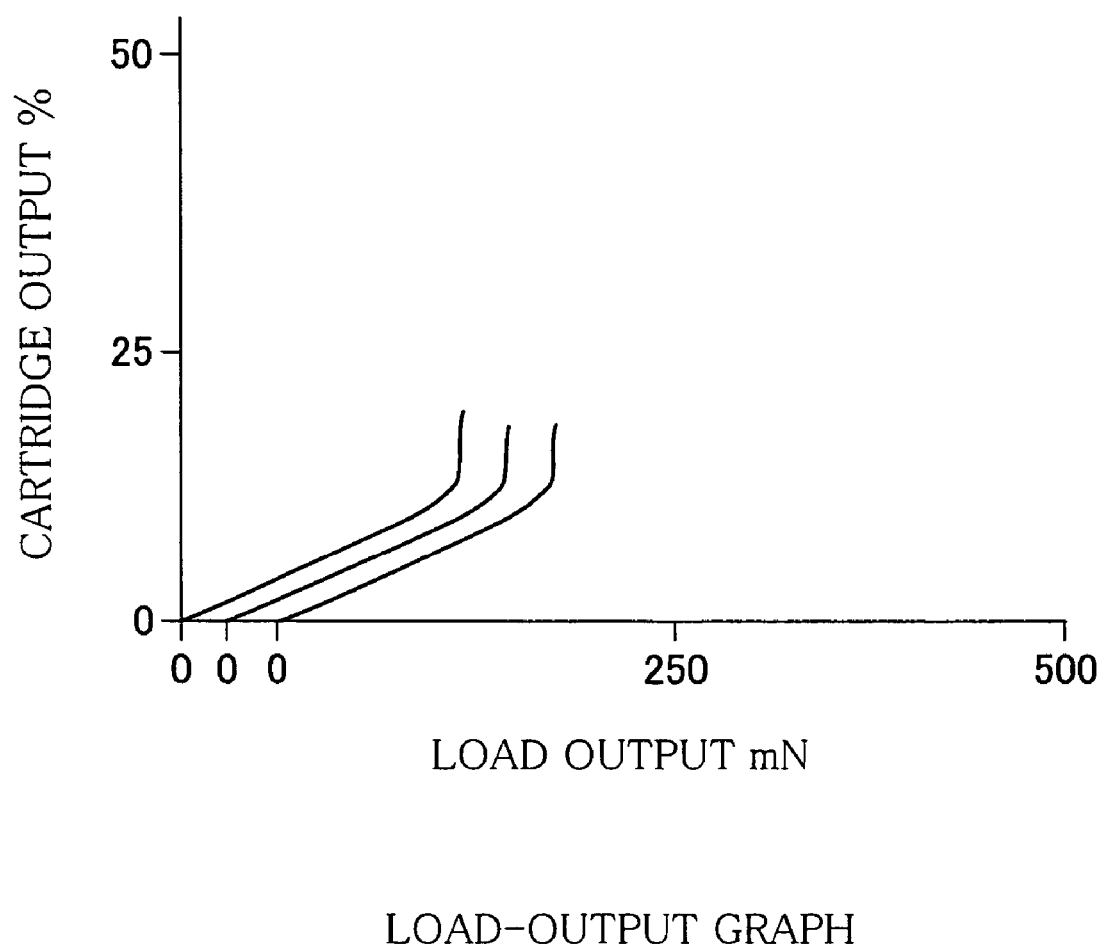
FIG. 11 is a load vs. output graph.
Figure 12:
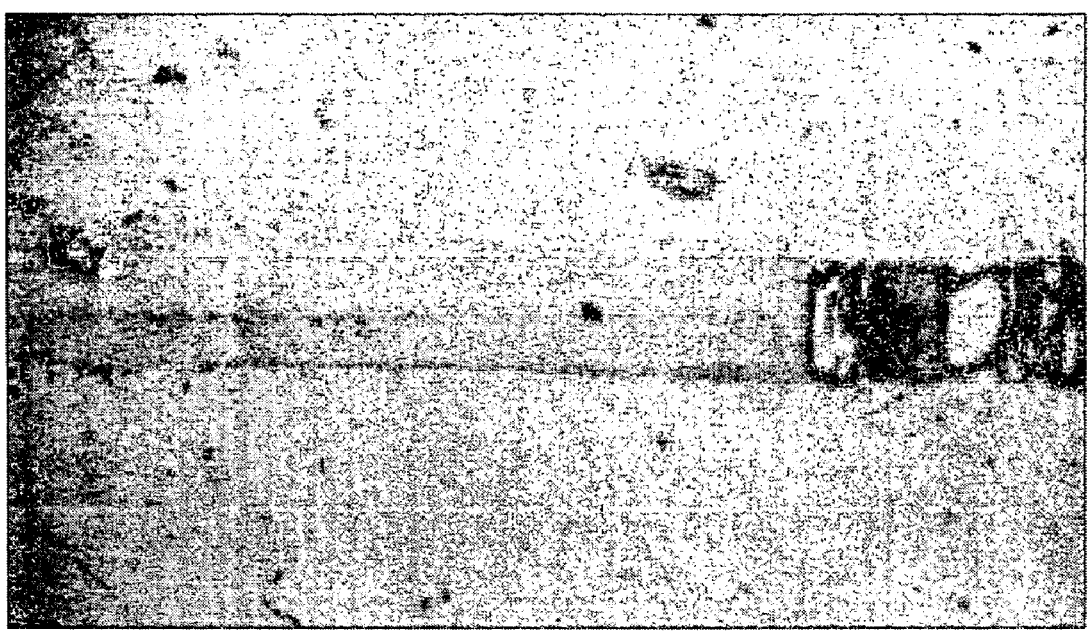
FIG. 12 is a microscope photograph (image) of a scratch.

Thin films, if easy to peel off, are very difficult to use as sensor elements. Accordingly, the adhesion strength of AlN thin films needs be measured. The adhesion strength of AlN thin films were evaluated by scratch tests with a scan scratch tester (Shimazu SST-101). A load-cartridge output graph is shown in FIG. 11. A microscopic photograph (×150) of a scratch is shown in FIG. 12.

Details of scratch test conditions are shown in Table 18. Three scratch tests were conducted. The mean peel-off load was 169.2 mN, the standard deviation 1.0, and coefficient of variation 0.6%. Measurement was performed with good reproducibility. Peel-off loads were readily obtained from scratch images in the microscope vision (see FIG. 12). The peel-off load of 169.2 mN under these measurement conditions is higher than typical thin film adhesion strength, indicating that the adhesion strength of the AlN thin film is sufficient for sensor element use.

TABLE 18

Measurement conditions for scratch test equipment

| | |
|---|---|
| Cartridge tip diameter (mm) | 15 |
| Full-scale load (mN) | 200 |
| Load rate (μm/s) | 2 |
| Width (μm) | 100 |
| Feed rate (μm/s) | 10 |

In examples 3, 4, and 5, cracks and pinholes were possible causes of the short circuiting of the top and bottom electrodes. To prevent the occurring of these cracks and pinholes, the effects of the fabrication temperature of the bottom electrode and those of the fabrication method of the bottom electrode were examined. If a Ti/Pt thin film was used as the bottom electrode, fabrication at room temperature or 400° C. produced samples with no short circuits. The samples fabricated at room temperature or 400° C. experienced no short circuiting, because a fine structure film was formed without there being any spaces between particles. In addition, the orientation and crystallinity of the AlN thin film decreased with an increase in the fabrication temperature of the bottom electrode, presumably because the orientation and crystallinity of the Pt thin film which was the bottom electrode decreased with fabrication temperature. These results indicate that fabricating the bottom electrode at room temperature produces smooth-surfaced AlN thin films with no short circuits which exhibit high orientation and high crystallinity.

The effects of fabrication temperature on short circuiting were examined further on four other bottom electrode materials (Cr/Pt, Ti/Pt/Au, Ti/Ni/Au, Cr/Ni/Au). The effects of the fabrication temperature turned out differing depending on the stack structure of the electrode thin film. None of Cr/Pt samples fabricated at 300° C., none of Ti/Pt/Au samples at room temperature, and none of Cr/Ni/Au samples at any temperature experienced short circuits.

Examining the effects of electrode fabrication methods, comparing r.f. plasma-assisted sputtering and DC sputtering, none of the samples fabricated by r.f. plasma-assisted sputtering experienced short circuiting. By r.f. plasma-assisted sputtering, the probability of no short circuits was improved.

The adhesion strength of AlN thin films was evaluated by a scratch test with a scratch tester. A peel-off load of 169.2 mN was obtained. The AlN thin film was confirmed to have a relatively high adhesion strength.

To apply the present example to the development of mass production technology for aluminum nitride thin films, we reviewed the fabrication of high-oriented aluminum nitride (AlN) thin films, measures which prevent cracks and other factors from leading to short circuits, the improvement of sensitivity of thin films, and the identification of mass production deposition conditions. As a result, by optimizing the type and stack structure of the bottom electrode, a superhigh orientation AlN thin film with a rocking curve full width half maximum of 0.4° was fabricated on a glass substrate. In addition, by optimizing the electrode fabrication temperature and fabricating the bottom electrode by r.f. plasma-assisted sputtering to fabricate thin films with no short circuits, the probability of short circuits could be reduced.

As a result, the effects of the fabrication temperature differed depending on the stack structure of the electrode thin film. None of Cr/Pt samples fabricated at 300° C., Ti/Pt/Au samples at room temperature, and Cr/Ni/Au samples at any temperature experienced short circuits. Fabrication by r.f. plasma-assisted sputtering could reduce the probability of short circuits. In addition, measurements of adhesion strength between the AlN thin film and the glass substrate revealed a relatively high strength.

It is preferable in a piezoelectric element based on the superhigh-oriented aluminum nitride thin film if the bottom electrode contains either two layers of Ti/Pt or Cr/Pt or three layers of Ti/Pt/Au, Ti/Ni/Au, or Cr/Ni/Au. The notation "A/B" indicates that the metal A sits on the substrate, that is, the first layer, and that the metal B sits on the metal A, that is, the second layer. The notation "A/B/C" indicates that the metal A sits on the substrate, that is, the first layer, that the metal B sits on the metal A, that is, the second layer, and that the metal C sits on the metal B, that is, the third layer.

It is preferable in a piezoelectric element based on the superhigh-oriented aluminum nitride thin film if the substrate is a glass substrate.

It is preferable in a manufacturing method of a piezoelectric element based on the superhigh-oriented aluminum nitride thin film if a glass substrate is used as the substrate.

It is preferable in a manufacturing method of a piezoelectric element based on the superhigh-oriented aluminum nitride thin film if the bottom electrode is deposited by r.f. plasma-assisted sputtering.

The embodiments and examples described in Best Mode for Carrying Out the Invention are for illustrative purposes only and by no means limit the scope of the present invention. Variations are not to be regarded as a departure from the spirit and scope of the invention, and all such modifications as would be obvious to one skilled in the art are intended to be included within the scope of the claims.

INDUSTRIAL APPLICABILITY

Despite using glass or other cheap substrates, the present invention has successfully provided a high performance piezoelectric element by forming a bottom electrode from a W layer on the substrate without an intervening adhesive layer. The invention further achieved both high performance and high quality. "High quality" refers to the absence of hillocks, cracks, and peeling. "High performance" means that the piezoelectric element of the invention is substantially equivalent to piezoelectric elements on monocrystal substrates. The significance of the present invention is that it has made it possible to provide piezoelectric elements based on high performance, high quality aluminum nitride thin films formed on glass and other cheap substrates. Further, the present invention has successfully provided a high performance, high quality piezoelectric element on cheap substrates by selecting a suitable material for the surface layer of the bottom electrode in forming not only a single W layer, but also a bottom electrode which is a stack body including an adhesive layer. Further, the present invention has successfully provided a manufacturing method for the high performance, high quality piezoelectric elements which causes no hillocks, cracks, or peeling, by controlling particle shape and in addition depositing by r.f. plasma-assisted sputtering.

The present invention can form aluminum nitride thin films with superhigh c-axis orientation not only on monocrystal substrates, but also on quartz glass and other cheap and numerous kinds of substrates, by considering the matching of the crystal structures of the bottom electrode and the aluminum nitride to form a suitable surface crystal structure as an attempt to eliminate substrate factors disrupting the orientation of the aluminum nitride. Therefore, the invention gives freedom in configuration and design of the piezoelectric element and is highly applicable.

The invention claimed is:

1. A piezoelectric element using a superhigh-oriented aluminum nitride thin film,
   the piezoelectric element being free from hillocks, cracks, and peeling and including a stack structure in which a bottom electrode, a piezoelectric body thin film, and a top electrode are sequentially formed on a substrate,
   the bottom electrode being made of an oriented W layer of which a (111) plane of W is parallel to a surface of the substrate, and
   the piezoelectric body thin film being formed of a c-axis-oriented aluminum nitride thin film having a rocking curve full width half maximum (RCFWHM) not exceeding 2.5°.

2. The piezoelectric element using a superhigh-oriented aluminum nitride thin film as set forth in claim 1, wherein the substrate is a glass substrate.

3. A piezoelectric element using a superhigh-oriented aluminum nitride thin film,
   the piezoelectric element being free from hillocks, cracks, and peeling and including a stack structure in which a bottom electrode, a piezoelectric body thin film, and a top electrode are sequentially formed on a substrate, the bottom electrode containing as a bottom layer an adhesive layer adhering to the substrate,
   the bottom electrode being made of a stack body,
   the stack body having a surface layer made of a metal layer having an electronegativity of around 1.4 and such an orientation that a crystal plane of a metal having an identical atomic configuration to an atomic configuration on a (001) plane of aluminum nitride and an almost equal atomic distance to an atomic distance on the (001) plane is parallel to a surface of the substrate, and the piezoelectric body thin film being formed of a c-axis-oriented aluminum nitride thin film having a rocking curve full width half maximum (RCFWHM) not exceeding 2.5°.

4. The piezoelectric element using a superhigh-oriented aluminum nitride thin film as set forth in claim 3, wherein the substrate is a glass substrate.

5. A piezoelectric element using a superhigh-oriented aluminum nitride thin film, the piezoelectric element being free from hillocks, cracks, and peeling and including a stack structure in which a bottom electrode, a piezoelectric body thin film, and a top electrode are sequentially formed on a substrate, the bottom electrode containing as a bottom layer an adhesive layer adhering to the substrate, the bottom electrode being made a stack body containing as a surface layer such an oriented W, Pt, Au, or Ag layer that a (111) plane of W, Pt, Au, or Ag is parallel to a surface of the substrate, and the piezoelectric body thin film being formed of a c-axis-oriented aluminum nitride thin film having a rocking curve full width half maximum (RCFWHM) not exceeding 2.5°.

6. The piezoelectric element using a superhigh-oriented aluminum nitride thin film as set forth in claim 5, wherein the bottom electrode is made up of either two layers of Ti/Pt or Cr/Pt in accordance with a notation, "the first layer formed on the substrate/the second layer formed on the first layer" or three layers of Ti/Pt/Au, Ti/Ni/Au, or Cr/Ni/Au in accordance with a notation, "the first layer formed on the substrate/the second layer formed on the first layer/the third layer formed on the second layer."

7. The piezoelectric element using a superhigh-oriented aluminum nitride thin film as set forth in claim 5, wherein the substrate is a glass substrate.

8. A method of manufacturing a piezoelectric element using a superhigh-oriented aluminum nitride thin film, the method comprising the sequential steps of:

forming a bottom electrode on a substrate from such an oriented W layer that a (111) plane of W is parallel to a surface of the substrate by sputtering at a temperature from room temperature to a low temperature at which no spaces develop between W particles; and forming a piezoelectric body thin film of a c-axis-oriented aluminum nitride thin film having a rocking curve full width half maximum (RCFWHM) not exceeding 2.5° on the bottom electrode; and forming a top electrode on the piezoelectric body thin film.

9. The method of manufacturing a piezoelectric element using a superhigh-oriented aluminum nitride thin film as set forth in claim 8, wherein the substrate is a glass substrate.

10. The method of manufacturing a piezoelectric element using a superhigh-oriented aluminum nitride thin film as set forth in claim 8, wherein the bottom electrode is deposited by r.f. plasma-assisted sputtering.

11. A method of manufacturing a piezoelectric element using a superhigh-oriented aluminum nitride thin film, the method comprising the sequential steps of:

in forming, on a substrate, a bottom electrode of a two- or more-layered stack structure including an adhesive layer adhering to the substrate, firstly depositing the adhesive layer by sputtering at a temperature from room temperature to a low temperature at which no spaces develop between particles and then depositing as a surface layer of the bottom electrode a metal layer by sputtering at a temperature from room temperature to a low temperature at which no spaces develop between particles so that the metal layer exhibits such orientation that a crystal plane of a metal is parallel to a surface of the substrate, by using such a metal having an electronegativity of around 1.4 that a crystal plane of the metal has an identical atomic configuration to an atomic configuration on a (001) plane of aluminum nitride and an almost equal atomic distance to an atomic distance on the (001) plane;

forming a piezoelectric body thin film of a c-axis-oriented aluminum nitride thin film having a rocking curve full width half maximum (RCFWHM) not exceeding 2.5° on the bottom electrode; and forming a top electrode on the piezoelectric body thin film.

12. The method of manufacturing a piezoelectric element using a superhigh-oriented aluminum nitride thin film as set forth in claim 11, wherein the substrate is a glass substrate.

13. The method of manufacturing a piezoelectric element using a superhigh-oriented aluminum nitride thin film as set forth in claim 11, wherein the bottom electrode is deposited by r.f. plasma-assisted sputtering.

14. A method of manufacturing a piezoelectric element using a superhigh-oriented aluminum nitride thin film, the method comprising the sequential steps of:

in forming, on a substrate, a bottom electrode of a two- or more-layered stack structure including an adhesive layer adhering to the substrate, firstly depositing the adhesive layer by sputtering at a temperature from room temperature to a low temperature at which no spaces develop between particles and then depositing as a surface layer an oriented W, Pt, Au, or Ag layer that a (111) plane of W, Pt, Au, or Ag is parallel to a surface of the substrate by sputtering at a temperature from room temperature to a low temperature at which no spaces develop between particles;

forming a piezoelectric body thin film of a c-axis-oriented aluminum nitride thin film having a rocking curve full width half maximum (RCFWHM) not exceeding 2.5° on the bottom electrode; and forming a top electrode on the piezoelectric body thin film.

15. The method of manufacturing a piezoelectric element using a superhigh-oriented aluminum nitride thin film as set forth in claim 14, wherein the substrate is a glass substrate.

16. The method of manufacturing a piezoelectric element using a superhigh-oriented aluminum nitride thin film as set forth in claim 14, wherein the bottom electrode is deposited by r.f. plasma-assisted sputtering.

17. A piezoelectric element using a superhigh-oriented aluminum nitride thin film, the piezoelectric element including a bottom electrode, a piezoelectric body thin film of aluminum nitride, and a top electrode stacked in this order on a substrate; and the aluminum nitride having a rocking curve (RCFWHM) not exceeding 2.5°, wherein the bottom electrode is either a single, metal layer or a stack body including an adhesive layer adhering to the substrate and one or more metal layers; and wherein the stack body has a surface layer made of a metal having a crystal plane having an identical atomic configuration to an atomic configuration on a (001) plane of aluminum nitride and an almost equal atomic distance to an atomic distance on the (001) plane.

18. The piezoelectric element using a superhigh-oriented aluminum nitride thin film as set forth in claim 17, wherein the stack body has a surface layer made of a metal having an electronegativity between 1.3 and 1.5 inclusive.

19. The piezoelectric element using a superhigh-oriented aluminum nitride thin film as set forth in claim 17, wherein the substrate is a glass substrate.

20. A piezoelectric element using a superhigh-oriented aluminum nitride thin film,
- the piezoelectric element including a bottom electrode, a piezoelectric body thin film of aluminum nitride, and a top electrode stacked in this order on a substrate; and
- the aluminum nitride having a rocking curve (RCFWHM) not exceeding 2.5°,
- wherein the bottom electrode is either a single, metal layer or a stack body including an adhesive layer adhering to the substrate and one or more metal layers on the adhesive layer; and
- wherein the stack body has as a surface layer an oriented W, Pt, Au, or Ag layer that a (111) plane of W, Pt, Au, or Ag is parallel to a surface of the substrate.

21. A piezoelectric element using a superhigh-oriented aluminum nitride thin film,
- the piezoelectric element including a bottom electrode, a piezoelectric body thin film of aluminum nitride, and a top electrode stacked in this order on a substrate; and
- the aluminum nitride having a rocking curve (RCFWHM) not exceeding 2.5°,
- wherein the bottom electrode is either a single, metal layer or a stack body including an adhesive layer adhering to the substrate and one or more metal layers on the adhesive layer; and
- wherein the stack body is made up of either two layers of Ti/Pt or Cr/Pt in accordance with a notation, "the first layer formed on the substrate/the second layer formed on the first layer" or three layers of Ti/Pt/Au, Ti/Ni/Au, or Cr/Ni/Au in accordance with a notation, "the first layer formed on the substrate/the second layer formed on the first layer/the third layer formed on the second layer."

* * * * *